(12) United States Patent
Kawagoe

(10) Patent No.: US 6,243,307 B1
(45) Date of Patent: Jun. 5, 2001

(54) SEMICONDUCTOR DEVICE INCLUDING TESTER CIRCUIT SUPPRESSIBLE OF CIRCUIT SCALE INCREASE AND TESTING DEVICE OF SEMICONDUCTOR DEVICE

(75) Inventor: Tomoya Kawagoe, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/459,710

(22) Filed: Dec. 13, 1999

(30) Foreign Application Priority Data

Jun. 18, 1999 (JP) .................................................. 11-172940

(51) Int. Cl.$^7$ ........................................................ G11C 7/00
(52) U.S. Cl. ........................... 365/201; 365/200; 714/719; 714/733
(58) Field of Search ................................. 365/201, 200, 365/189.01; 714/718, 719, 733

(56) References Cited

U.S. PATENT DOCUMENTS 5,214,611 * 5/1993 Shigehara et al. .................... 365/236
5,544,098 * 8/1996 Matsuo et al. .................. 365/189.07
5,841,711 * 11/1998 Watanabe .............................. 365/200

FOREIGN PATENT DOCUMENTS

| 4-330710 | 11/1992 | (JP) . |
| 4-339399 | 11/1992 | (JP) . |
| 11-16390 | 1/1999 | (JP) . |
| 11163900 | 6/1999 | (JP) . |

* cited by examiner

Primary Examiner—David Nelms
Assistant Examiner—Hoai V. Ho
(74) Attorney, Agent, or Firm—McDermott, Will & Emery

(57) ABSTRACT

After writing data into a memory cell array according to an internal address signal, data read out from each memory cell is compared with expected value data in a read out operation. When there are two spare rows and two spare columns provided, a replacement determination unit is provided for each of the sixth types of sequences sequentially replacing a memory cell row and a memory cell column. A defective address is written into four sets of storage cell trains provided corresponding to each replacement determination unit only when a defective memory cell is detected having an address differing from at least one of a row address and column address of a defective memory cell that is already stored.

19 Claims, 21 Drawing Sheets

FIG.9

Label1

| | STEP 1 | STEP 2 | STEP 3 | STEP 4 |
|---|---|---|---|---|
| Case1 | R11 | R12 | C13 | C14 |
| Case2 | R21 | C22 | R23 | C24 |
| Case3 | R31 | C32 | C33 | R34 |
| Case4 | C41 | R42 | R43 | C44 |
| Case5 | C51 | R52 | C53 | R54 |
| Case6 | C61 | C62 | R63 | R64 |

FIG.14

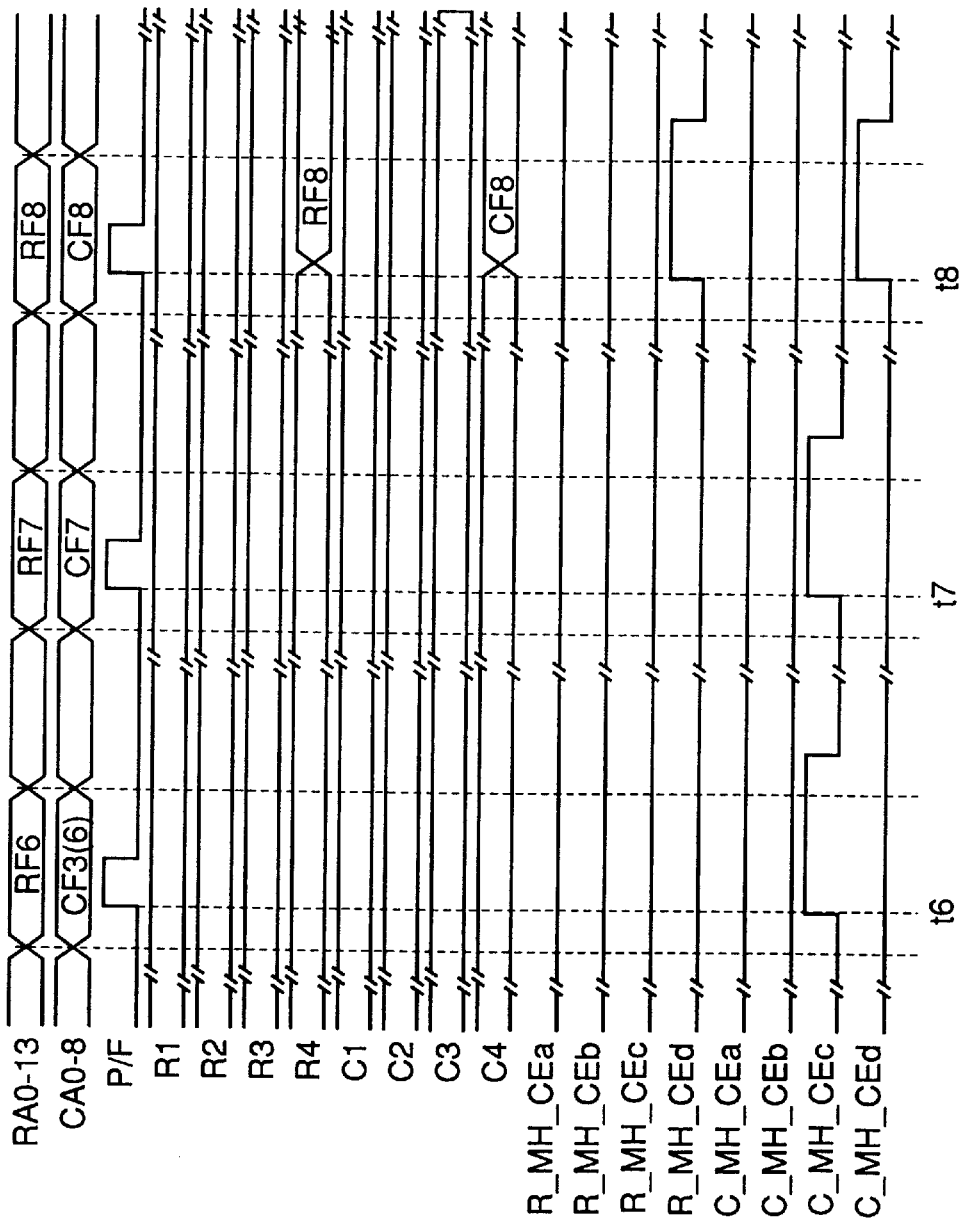

SEMICONDUCTOR DEVICE INCLUDING TESTER CIRCUIT SUPPRESSIBLE OF CIRCUIT SCALE INCREASE AND TESTING DEVICE OF SEMICONDUCTOR DEVICE

BACKGROUND OF THE INVENTION

1. Field of the Invention

The present invention relates to a semiconductor device incorporating a tester circuit to test a semiconductor device, particularly a semiconductor memory device. The present invention also relates to the structure of a testing device to test a semiconductor device incorporating such a tester circuit.

2. Description of the Background Art

Most semiconductor memory devices include spare memory cells to allow a defective memory cell, if present, to be replaced with the spare memory cell to repair the defective chip.

FIG. 19 is a schematic block diagram showing a structure of a redundant circuit provided for a memory array unit 8010 of such a semiconductor memory device.

One memory cell in memory array unit 8010 is selected by externally applied row address signals RA0–13 and column address signals CA0–8. In a write operation, the data applied to a data input/output terminal DQ (not shown) is written into the selected memory cell. In a read out operation, the data read out from memory array unit 8010 is provided to data input/output terminal DQ.

A row decoder 8020 responds to the input row address to select memory cells of one row for a read or write operation. A column decoder 8030 selects one column according to the input column address and further selects one memory cell out of the one row of memory cells selected according to the row address.

In the structure of FIG. 19, two spare rows SR1 and SR2, and two spare columns SC1 and SC2 are provided as the spare memory cells. Spare row SR1 is constituted by one row of memory cells SRM1 and a spare row decoder SRD1. Spare row SR2 is constituted by one row of memory cells SRM2 and a spare row decoder SRD2.

Spare column SC1 is constituted by one column of memory cells SCM1 and a spare column decoder SCD1. Spare column SC2 is constituted by one column of memory cells SCM2 and a spare column decoder SCD2.

In spare row decoders SRD1 and SRD2, a row address corresponding to a defective memory cell is recorded in advance. The input row address is compared with the row address corresponding to the defective memory cell. When the row addresses match, a corresponding spare memory cell SRM1 or SRM2 is selected. When spare row memory cell SRM1 or SRM2 is selected, spare row decoders SRD1 and SRD2 control row decoder 8020 so that a memory cell of the normal memory array is not selected.

Similarly, a column address corresponding to a defective memory cell is recorded in advance in spare column decoders SCD1 and SCD2. Spare column decoders SCD1 and SCD2 compare the input column address with this recorded column address corresponding to a defective memory cell. When the column addresses match, a corresponding spare column memory cell SCM1 or SCM2 is selected. When spare column memory cell SCM1 or SCM2 is selected, spare column decoders SCD1 and SCD2 control column decoder 8030 so that a memory cell in the normal memory array is not selected.

In the case where there is a defective memory cell in the memory array, that memory cell is replaced by spare rows SR1 and SR2 or spare columns SC1 and SC2 to repair the defective memory cell. For example, consider the case where there are defective memory cells DBM1 to DBM8 in the memory array, as shown in FIG. 19.

It is assumed that defective memory cells DBM2–DBM4 correspond to the same row address RF2, and defective memory cells DBM3 and DBM5–DBM7 correspond to the same column address CF3.

Therefore, by replacing the rows corresponding to row addresses RF1 and RF2 in the normal memory array with spare rows SR1 and SR2, and by replacing the columns corresponding to column addresses CF3 and CF8 with spare columns SC1 and SC2, memory array 8010 can be repaired.

FIG. 20 is a schematic block diagram showing a structure of a memory tester 9000.

Memory tester 9000 has a redundancy analysis function to detect a defective memory cell in a semiconductor memory device 8000 and to determine whether semiconductor memory device 8000 can be repaired by replacement with either a spare row or a spare column.

Memory tester 9000 includes a signal generator 9010, a comparator 9020, a failure memory 9030, and an analysis device 9040.

Signal generator 9010 generates and provides to semiconductor memory device 8000 that is the subject of measurement row address signals RA0–13, column address signals CA0–8 and write data TD used for testing.

Although not shown, signal generator 9010 also generates other control signals such as a write enable signal WE, a chip select signal /CS, a row address strobe signal /RAS and a column address strobe signal /CAS. which are provided to under-measurement semiconductor memory device 8000.

Furthermore, signal generator 9010 generates expected value data ED corresponding to write data TD in the read out operation in the test mode. Comparator 9020 compares the data output from semiconductor memory device 8000 with expected value data ED to determine whether under-measurement semiconductor memory device 8000 outputs the proper data. The determination result is output as a pass/fail signal P/F.

Failure memory 9030 includes storage elements identical in number with that of the memory cells in under-measurement semiconductor memory device 8000.

Failure memory 9030 stores the level of the determination resultant signal P/F output from comparator 9020 in the storage element specified by row address signals RA0–13 and column address signals CA0–8 output from signal generator 9010.

Analysis device 9040 reads out the data from failure memory 9030 to analyze which of the spare row and the spare column the defective memory should be replaced for repair.

Analysis device 9040 provides the address of the defective memory to be repaired to a repair device, for example, a laser trimmer device. The laser trimmer device programs the value of the defective address by trimming the fuse element provided in semiconductor memory device 8000. Details of laser trimming is disclosed in, for example, Japanese Patent Laying-Open No. 4-330710.

In a conventional memory tester 9000, the capacity of failure memory 9030 had to be increased reflecting increase in the memory capacity of under-measurement semiconductor memory device 8000. Failure memory 9030 is expensive and must allow high speed operation. Therefore, there was a problem that increasing the capacity of failure memory 9030 is costly.

Recently, a semiconductor memory device with a built-in testing device or a semiconductor device incorporating a semiconductor memory device with a built-in testing device are fabricated. The semiconductor device includes a signal generator 9010 to carry out testing without a memory tester. Although detection can be made whether there is a defective memory cell in the memory array in such semiconductor memory devices or semiconductor devices with the built-in testing device, it was difficult to effect a test realizing the redundancy analysis function itself. Redundancy analysis could not be carried out since it is difficult to incorporate in a semiconductor memory device or a semiconductor device a failure memory 9030 that requires a large amount of capacity equal to that of the under-measurement semiconductor memory device or the semiconductor memory device incorporated in a semiconductor device.

SUMMARY OF THE INVENTION

An object of the present invention is to provide a semiconductor memory device or a semiconductor device incorporating a semiconductor memory device with a built-in tester circuit that can detect a defective memory cell and that can replace the defective memory cell with a redundant memory cell.

Another object of the present invention is to provide a testing device that can detect a defective memory cell speedily and that can carry out redundancy analysis with a simple structure even in the case where the memory capacity of the under-measurement semiconductor memory device or the semiconductor memory device incorporated in an under-measurement semiconductor device is increased.

According to an aspect of the present invention, a semiconductor memory device includes a memory cell array, a memory cell select circuit, a data transmission circuit, and a tester circuit.

The memory cell array includes a plurality of memory cells arranged in a matrix to retain stored data. The memory cell array includes a normal memory cell array and a spare memory cell array. The normal memory cell array includes a plurality of normal memory cells. The spare memory cell array includes a plurality of spare memory cells.

The memory cell select circuit selects a memory cell according to an address signal. The data transmission circuit transmits stored data to/from the selected memory cell.

The test circuit detects a defective memory cell in the normal memory cell to determine which of the spare memory cells the defective memory cell is to be replaced with. The tester circuit includes a signal generation circuit, a comparator circuit, an address storage circuit, and a determination circuit.

The signal generation circuit generates an address signal to sequentially select a memory cell, and generates test data which is to be written into a selected memory cell in a test write operation and expected value data which is to be read out from a memory cell in a test read out operation.

The comparator circuit compares the stored data from the selected memory cell with the expected value data in a test read out operation.

The address storage circuit stores a defective address corresponding to the defective memory cell according to the comparison result of the comparator circuit.

The determination circuit determines which of the spare memory cells is to be used for replacement according to the defective address stored in the address storage circuit. The address storage circuit selectively stores a defective address differing from the defective address that is already stored out of the sequentially detected defective addresses.

Preferably, the spare memory cell array includes m (m: natural number) spare memory cell rows and n (n: natural number) spare memory cell columns. The determination circuit includes a plurality of replacement determination units provided corresponding to respective combinations of step sequence of sequentially replacing the m spare memory cell rows and n spare memory cell columns with a normal memory cell row or a normal memory cell column including the defective memory cell. The address storage circuit includes m storage cell trains provided corresponding to the plurality of replacement determination units, respectively, to store m defective row addresses out of the defective addresses, and n storage cell trains provided corresponding to respective plurality of replacement determination units to store n defective column addresses out of the defective addresses. Each replacement determination unit renders corresponding m storage cell trains and n storage cell trains active according to a corresponding step sequence when a defective memory cell is detected having at least one of a row address and a column address differing from a defective row address or a defective column address that is already stored.

Alternatively, the spare memory cell array preferably includes m (m: natural number) spare memory cell rows and n (n: natural number) spare memory cell columns. The determination circuit includes a plurality of replacement determination units provided corresponding to respective combinations of step sequence of sequentially replacing m spare memory cell rows and n spare memory cell columns with a normal memory cell row or normal memory cell column including the defective memory cell. The address storage circuit includes a plurality of storage cell trains provided for every i-th step (i: natural number, $1 \leq i \leq m+n$) out of the sequentially replacing steps, corresponding to a group of replacement determination units having a common replacement sequence of spare memory cell rows and spare memory cell columns before the i-th step, out of the plurality of replacement determination units. Each replacement determination unit renders active corresponding plurality of storage cell trains according to a corresponding step sequence when a defective memory cell is detected having at least one of a row address or a column address differing from the defective row address or defective column address that is already stored.

Alternatively, the spare memory cell array preferably includes m (m: natural number) spare memory cell rows and n (n: natural number) spare memory cell columns. The address storage circuit includes (m+n) first storage cell trains to store (m+n) defective row addresses, and (m+n) second storage cell trains provided corresponding to respective first storage cell trains to store (m+n) defective column addresses. The determination circuit stores, when a defective memory cell is detected having at least one of a row address and a column address differing from the defective row address or defective column address already stored in the first and second storage cell trains, the newly detected defective address at the next set of the first and second storage cell trains.

According to another aspect of the present invention, a testing device of a semiconductor device including a memory cell array having a normal memory cell array, m (m: natural number) spare memory cell rows, and n (n: natural number) spare memory cell columns includes a signal generation device, a comparator, an address storage circuit, and a determination circuit.

The signal generation device generates an address signal to sequentially select a memory cell in the semiconductor memory device, and generates test data to be written into a selected memory cell in a test write operation, and generates expected value data to be read out from a memory cell in a test read out operation.

The comparator compares the stored data from the selected memory cell with the expected value data in a test read out operation.

The address storage circuit stores a defective address corresponding to a defective memory cell according to the comparison result of the comparator.

The determination circuit determines which of the spare memory cells is to be used for replacement according to the defective address stored in the address storage circuit.

The address storage circuit selectively stores the defective address differing from the defective address that is already stored out of the sequentially detected defective addresses.

The main advantage of the present invention is that a tester circuit having a redundancy analysis function can be incorporated in the semiconductor device itself, capable of defective memory cell detection and redundancy analysis with respectively low circuit complexity.

Another advantage of the present invention is that information associated with all defective addresses corresponding to memory cells to be replaced can be obtained.

A further advantage of the present invention is that speedy detection of a defective memory cell and redundancy analysis can be realized with a simple structure even when the memory capacity of the under-measurement semiconductor memory device or the semiconductor memory device incorporated in an under-measurement semiconductor device is increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a systematic diagram for describing change in the state of each storage cell train.

FIG. 14 is a systematic diagram for describing change in the state of each storage cell train when there are three spare rows and three spare columns.

FIGS. 18A and 18B are timing charts for describing an operation of address replacement determinater 6000.

DESCRIPTION OF THE PREFERRED EMBODIMENTS

First Embodiment

Figure 1:
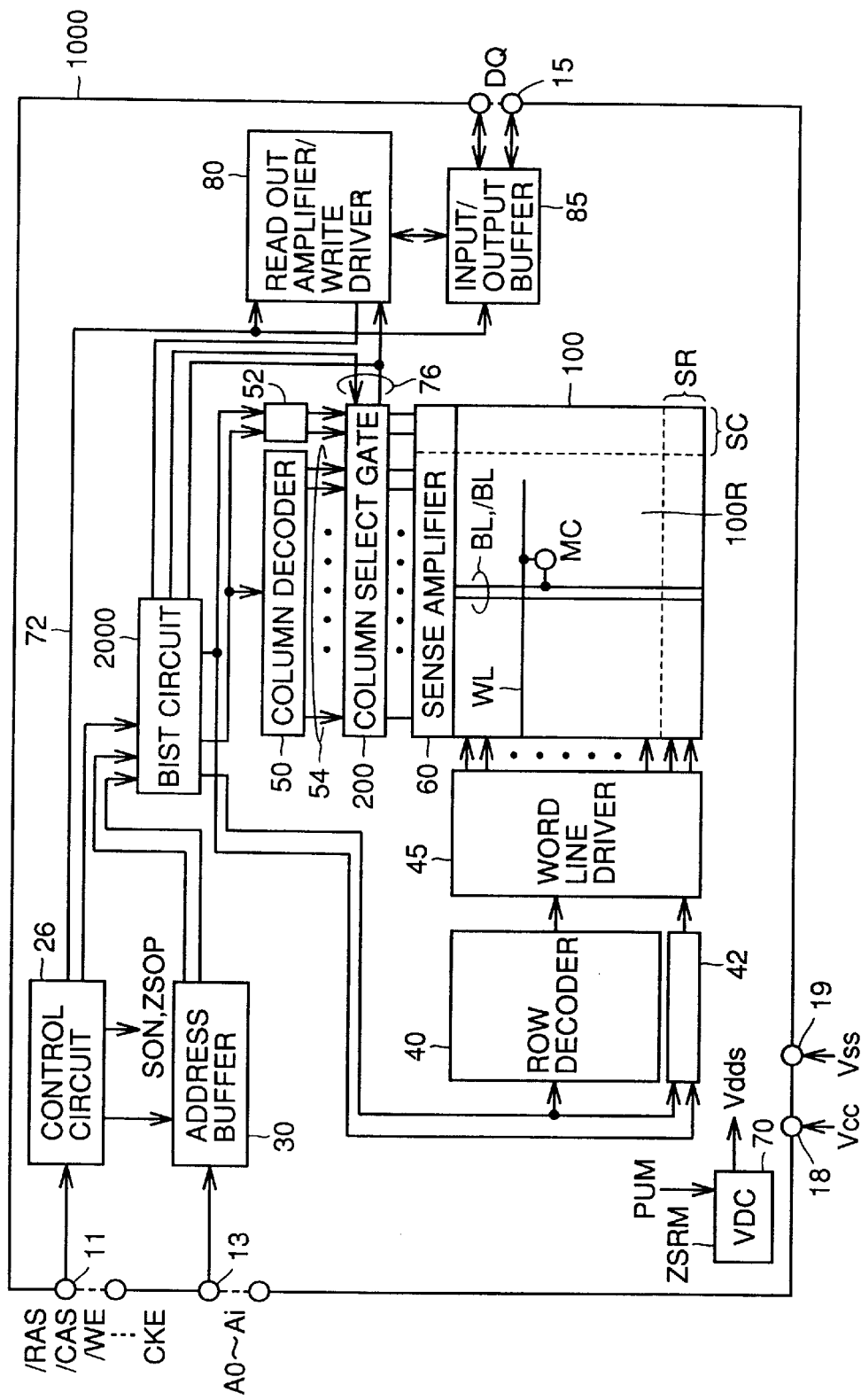
FIG. 1 is a schematic block diagram showing an entire structure of a dynamic semiconductor memory device 1000 according to a first embodiment of the present invention.

FIG. 1 is a schematic block diagram showing an entire structure of a dynamic semiconductor memory device (referred to as DRAM hereinafter) 1000 according to the first embodiment of the present invention.

It is appreciated that the built-in tester circuit of the present invention is not limited to being incorporated in DRAM 1000 of FIG. 1, but applicable to testing a semiconductor memory device incorporated in a semiconductor device, as will becomes apparent from the following description.

Referring to FIG. 1, DRAM 1000 includes a control signal input terminal group 11 receiving control signals such as a row address strobe signal /RAS, a column address strobe signal /CAS, a write enable signal /WE, a chip enable signal /CE and a clock enable signal CKE, an address input terminal group 13 receiving address signals A0–Ai (i: natural number), a data input/output terminal group 15 to input/output data, a Vcc terminal 18 receiving an external power supply potential Vcc, and a Vss terminal 19 receiving a ground potential Vss.

A signal CKE applied to control signal input terminal group 11 is a signal to designate that input of a control signal to the chip is allowed.

DRAM 1000 further includes a control circuit 26 generating an internal control signal that controls the operation of the entire DRAM 1000 according to a control signal, an internal control signal bus 72 through which the internal control signal is transmitted, an address buffer 30 receiving an external address signal from address input terminal group 13 to generate an internal address signal, and a memory cell array 100 with a plurality of memory cells MC arranged in a matrix.

An internal address signal implies internal row address signals RA0–13 and /RA0–13 complementary to each other and generated from external row address signals RA0–13, and internal column address signals CA0–8 and /CA0–8 complementary to each other and generated from external column signals CA0–8.

Memory cell MC is constituted by a capacitor to retain data, and an access transistor GM having a gate connected to a word line WL corresponding to each row.

In memory cell array 100, a word line WL is provided corresponding to each row of memory cells, and bit lines BL, /BL are provided corresponding to each column of memory cells.

Figure 19:
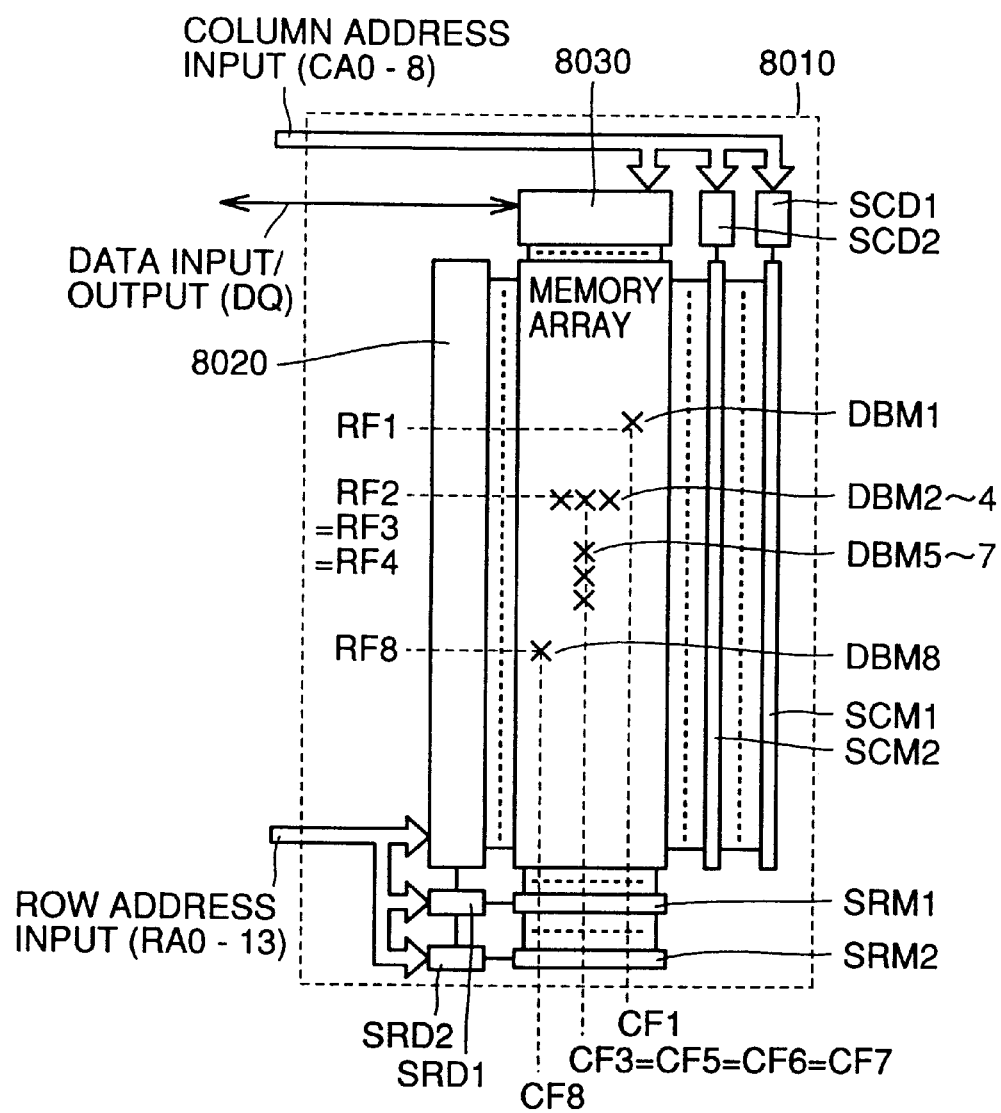
FIG. 19 is a schematic block diagram showing a structure of a redundant circuit provided corresponding to a memory array unit 8010 of a semiconductor memory device.

Memory cell array 100 of FIG. 1 includes a normal memory cell array 100, a spare row SR and a spare column SC, similar to memory cell array unit 8010 of FIG. 19.

In memory cell array 100, two spare rows SR1 and SR2 are provided as spare row SR, and two spare columns SC1 and SC2 are provided as spare column SC.

DRAM 1000 further includes a built-in self tester circuit (referred to as BIST circuit hereinafter) 2000 that detects a defective memory cell in DRAM 1000 and carries out a testing operation to effect replacement with a spare row SR or a spare column SC.

BIST circuit 2000 is under control of a control circuit 26 to provide internal row and column address signals from address buffer 30 directly to row decoder 40, spare row decoder 42, column decoder 50 and spare column decoder 52 in a normal operation mode. BIST circuit 2000 receives through data input/output terminal group 15 write data that is buffered by an input/output buffer 85 and provided from write driver circuit 80. The write data is directly output to column select gate 200 in a normal operation.

In the test mode, BIST circuit 2000 provides to row decoder 40, spare row decoder 42, column decoder 50 and spare column decoder 52 an internal address signal, generated within BIST 2000, not directly from address buffer 30. Test data is written into memory cell array 100 by applying to a column select gate 200 test write data TD generated within BIST circuit 2000, not the data applied from write driver 80.

When the write operation is completed in the test mode, BIST circuit 2000 generates an internal address signal again to read out the sequentially written data. BIST circuit 2000 sequentially detects the position of a defective memory cell in normal memory cell array 100 according to the comparison result between the read out data and expected value data ED. Then, determination is made of which combination of a spare row SR and a spare column SC the plurality of defective row addresses and defective column addresses corresponding to the plurality of defective memory cells are to be replaced with.

Upon completion of a read operation in the test mode, spare row decoder 42 and spare column decoder 52 store in a non-volatile manner respective defective row and column addresses that are to be replaced according to the determination of BIST circuit 2000. Therefore, a structure including an non-volatile storage element that can electrically write and read a replacement address designated from BIST circuit 2000 can be provided for spare row decoder 42 and spare column decoder 52. Alternatively, a structure in which the address corresponding to the memory cell to be replaced can be output to an external source at the end of the test operation. In this case, an external tester may provided an instruction to a repair device according to the output replacement address, whereby the repair device trims the fuse element of spare row decoder 42 and spare column decoder 52, as in the conventional case.

Following the above-described redundancy analysis by BIST circuit 2000, the normal read out and writing operations are to be carried out.

In the normal read and write operations, word line driver 45 selectively renders a corresponding word line WL active according to the output of row decoder 40 that decodes an internal row address signal from address buffer 30. Here, spare row decoder 42 activates word line WL of spare row SR and applies an instruction to row decoder 40 to inhibit a row select operation when the defective row address stored in an non-volatile manner matches the internal row address from address buffer 30.

According to the output of column decoder 50 that decodes an internal column address signal from address buffer 30, column decoder 50 renders a column select signal active. Spare column decoder 52 activates the column select signal corresponding to spare column SC and applies an instruction to column decoder 50 to inhibit a select operation when the internal column address signal from address buffer 30 matches the stored defective column address.

The column select signal is applied to column select gate 200 through a column select line 54. Column select gate 200 selectively connects a sense amplifier 60 that amplifies the data of bit line pair BL, /BL according to the column select signal with an I/O line 76.

I/O line 76 transmits the stored data to/from data input/output terminal 15 via a read out amplifier/write driver 80 and an input/output buffer 85. Accordingly, the stored data is transferred between data input/output terminal 15 and memory cell MC in a normal operation mode.

Control circuit 26 generates an internal control signal to control the internal operation of DRAM 1000 such as signals SON and ZSOP to render sense amplifier 60 active when control of the initiation/termination of the test operation of BIST circuit 2000 is carried out or when a read out operation is specified by a combination of external control signals.

DRAM 1000 further includes an internal potential generation circuit 70 receiving external power supply potential Vcc and ground potential Vss to generate an internal power supply potential Vdds corresponding to the potential of an H level (logical high) of the bit line pair. The generated potential is supplied to sense amplifier 60.

Figure 2:
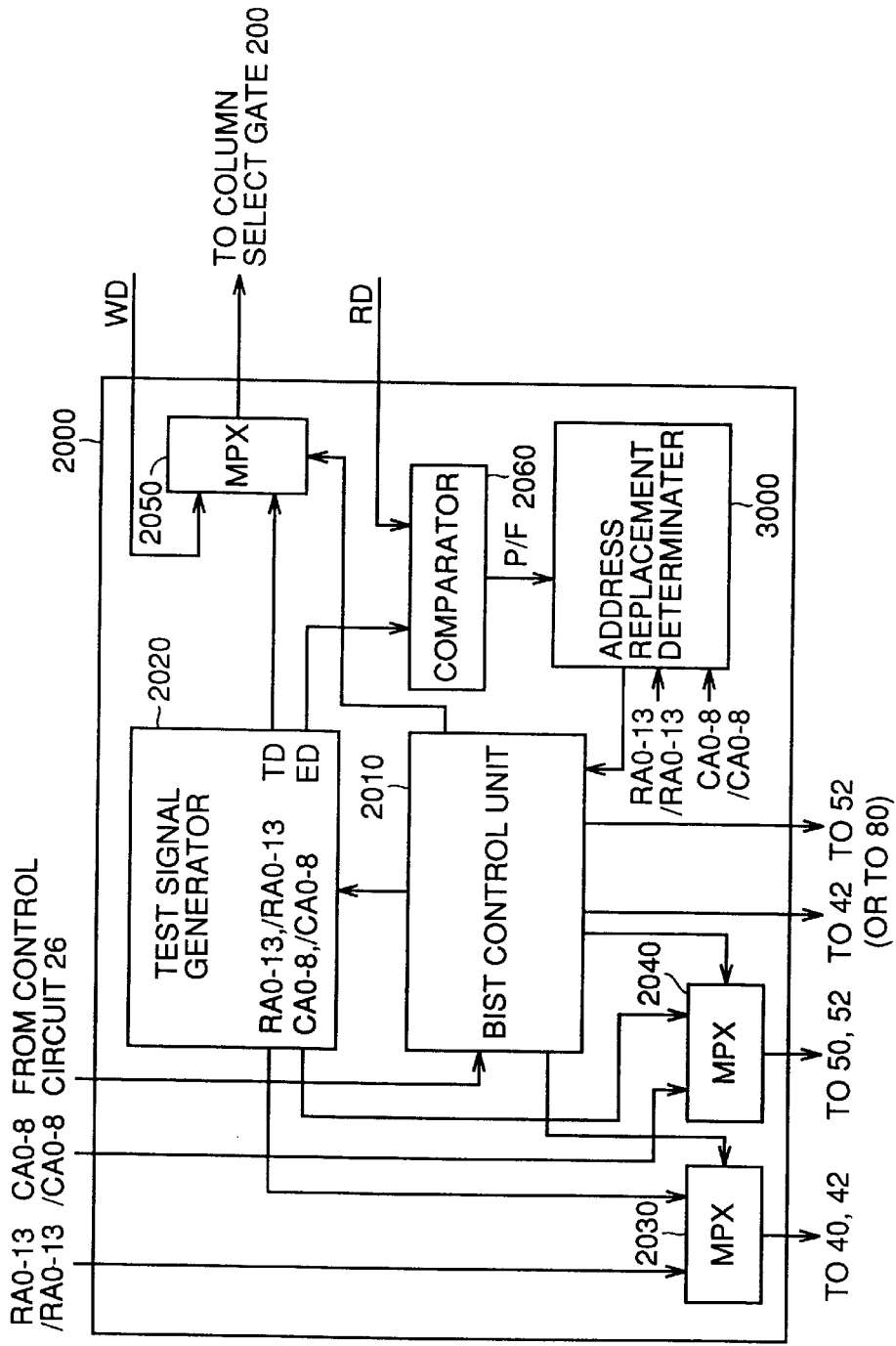
FIG. 2 is a schematic block diagram for describing a structure of a BIST circuit 2000 of FIG. 1.

Referring to FIG. 2, BIST circuit 2000 includes a BIST control unit 2010 to control a built-in test operation according to the control from control circuit 26, a test signal generator 2020 generating internal row address signals RA0–13, /RA0–13, internal column address signals CA0–8, /CA0–8, test write data TD and expected value data ED during a built-in test operation under control of BIST control unit 2010, a multiplexer 2030 under control of BIST control unit 2010, receiving internal row address signals RA0–13, /RA0–13 from address buffer 30 and the internal row address signal from test signal generator 20 to selectively apply one of the internal row address signals to row decoder 40 and spare row decoder 42 according to the operation mode, a multiplexer 2040 under control of BIST control unit 2010, receiving internal column address signals CA0–8, /CA0–8 from address buffer 30 and the internal column address signal from test signal generator 2020 to selectively provide one of the internal column address signals to column decoder 50 and spare column decoder 52 according to the operation mode, a multiplexer 2050 under control of BIST control unit 2010, receiving write data WD from write driver 80 and test write data TD from test signal generator 2020 to provide one of the write data to column select gate 200 according to the operation mode, a comparator 2060 comparing data RD read out from column select circuit 200 with expected value data ED from test signal generator 2020 to output a pass/fail signal P/F according to the match/mismatch of the comparison result in a read out operation in the built-in test mode, and an address replacement determinater 3000 receiving an internal column address signal and an internal row address signal output from test signal generator 2020 during the built-in test mode, and responsive to activation of pass/fail signal P/F from comparator 2060 (when data ED does not match data RD) to store the defective address in normal memory cell array 100 and to determine the defective address of the defective memory cell to be replaced with spare row SR and spare column SC.

When spare row decoder 42 and spare column decoder 52 include non-volatile storage elements that can be electrically rewritten according to the comparison result of address replacement determiner 3000, BIST control unit 2010 programs in these non-volatile storage elements the defective address corresponding to the defective memory cell to be replaced. Also, BIST control unit 2010 reads out the defective address to be replaced according to the determination result of address replacement determiner 3000 and provides the read out defective address outside from input/output terminal group 15 via amplifier 80 and input/output buffer 85.

Prior to description of the structure of address replacement determiner 3000 of FIG. 2 with reference to FIG. 3, the procedure of replacing the defective address in memory cell array 100 of FIG. 1 with spare row SR and spare column SC is summarized in the following.

It is assumed that the same defective memory cells in memory cell array unit 8010 of FIG. 19 are encountered in memory cell array 100 of the present embodiment.

Referring to FIG. 19 again, eight defective memory cells DBM1–DBM8 are detected while sequentially altering the row address and also the column address. The presence of a defective memory cell is detected in the sequence of defective memory cells DBM1–DBM8.

In the case where a defective address replacement process corresponding to defective memory cells is to be carried out with two spare rows SR1 and SR2 and two spare columns SC1 and SC2, there is the instance of all the defective memory cells being repaired or not depending on which sequence the spare row and spare column replaces the normal memory cell row or normal memory cell column corresponding to the defective memory cell.

For example, in the case where defective memory cell DBM1 (row address RF1, column address CF1) is replaced with spare row memory cell SRM1, defective memory cells DBM2–DBM4 (row address: both RF2; column address: CF2, CF3, CF4, respectively) are replaced with the second spare row memory cell SRM2, defective memory cells DBM5–DBM7 (column address: both CF5; row address: RF3, RF4, RF5, respectively) are replaced with the first spare column memory cell SCM1, and defective memory cell DBM8 (row address: RF8; column address: CF8) is replaced with the second spare column memory cell SCM2, all the defective memory cells DBM1–DBM8 can be replaced with the two spare rows SR1 and SR2 and the two spare columns SC1 and SC2.

However, when replacement is carried out in the order of replacing defective memory cell DBM1 with first spare column memory cell SCM1, defective memory cell DBM2 with second spare column memory cell SCM2, and then the third defective memory cell DBM3 with the first spare row memory cell SRM1, and the fifth defective memory cell DBM5 with the second spare row memory cell SRM2, not all the defective memory cells can be repaired by replacement with the two spare rows and two spare columns.

Thus, in the process where a defective memory cell is sequentially detected and replaced with a spare row or spare column, repair is allowed or not allowed depending upon the sequence of the replacement process of the spare row and spare column, as well as the distribution of the defective memory cells in the normal memory array.

In the case of two spare rows and two spare columns, there are the following sixth types of combinations of the sequence in which the sequentially detected defective memory cell is replaced with a spare row and a spare column depending upon the order of the step that carries out replacement with a spare row or a spare column out of the four steps of respective replacements.

In the following, R represents the case where replacement is carried out with a spare row and C represents the case where replacement with a spare column is carried out.

Case 1: R→R→C→C
Case 2: R→C→R→C
Case 3: R→C→C→R
Case 4: C→R→R→C
Case 5: C→R→C→R
Case 6: C→C→R→R Such combinations can be determined if the step out of the four steps that is to be carried out for replacement with a spare row is defined. The total number of such combinations corresponds to the number of combinations of $_{(2+2)}C_2=4!/(2!\cdot2!)=6$ when two are to be output from a total of 4 (2 spare rows+2 spare columns). Here, k! represents the factorial of a natural number k.

More generally, when there are m spare rows and n spare columns, the number of such combinations corresponds to $_{(m+n)}C_n={_{(m+n)}}C_m=(m+n)!/(m!\times n!)$ types.

When all the defective memory cells can be eventually replaced and repaired by two spare rows and two spare columns, there is inevitably a replacement process sequence of a spare row and spare column out of the above sixth types of sequence that allows all the defective memory cells to be repaired.

Figure 3:
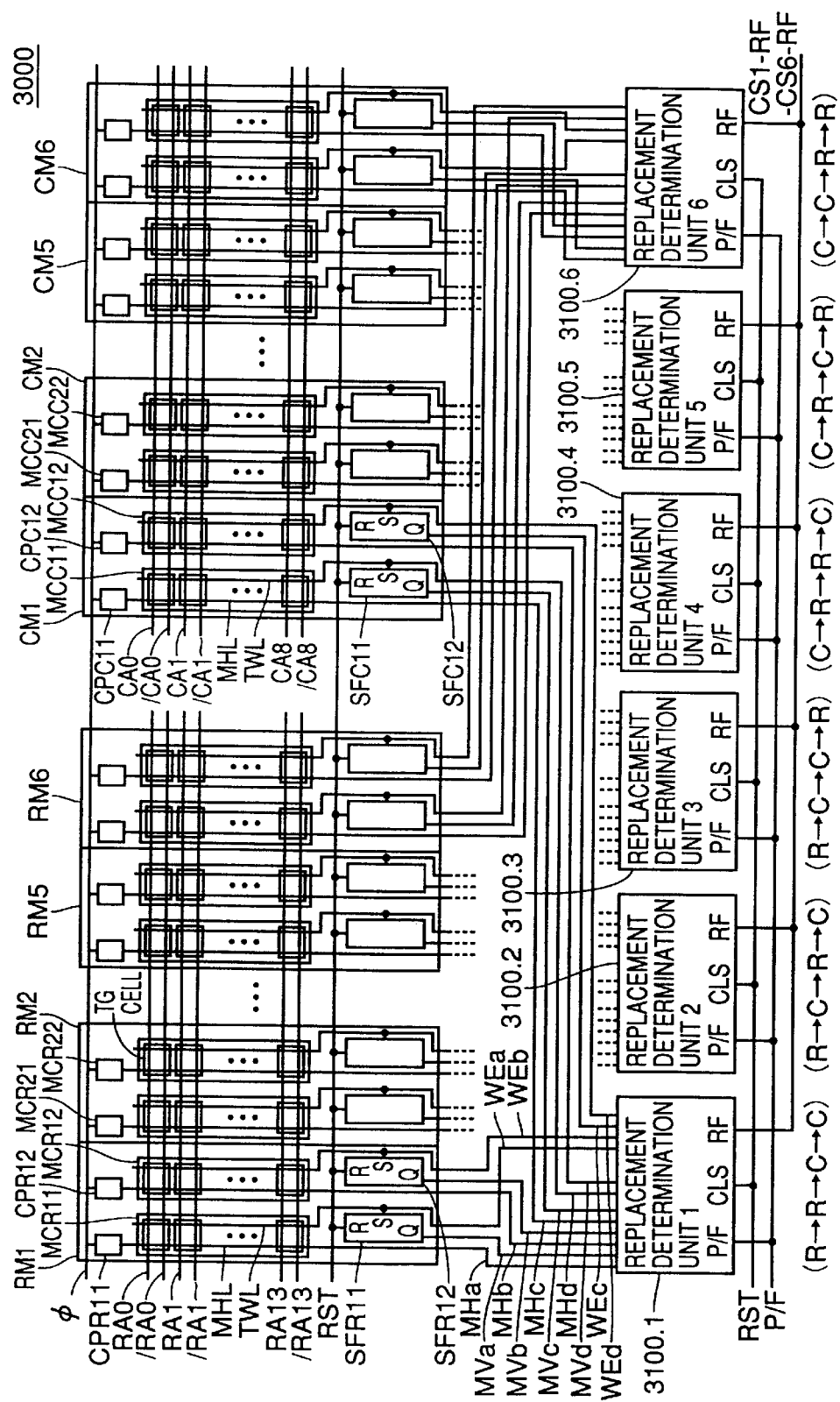
FIG. 3 is a schematic block diagram for describing a structure of an address replacement determinater 3000 of FIG. 2.

In address replacement determiner 3000 of FIG. 3, a structure of processing in parallel the sixth types is implemented to allow each of the above sixth types to be determined in parallel.

Referring to FIG. 3, address replacement determiner 3000 includes first to sixth replacement determination units 3100.1–3100.6 to determine whether repair is possible or not by replacement of the defective address when the defective address replacement process is carried out corresponding to each of the above cases 1–6.

Address replacement determination unit 3000 further includes row address storage units RM1–RM6 each storing the row address to be replaced with two spare row addresses, and column address storage units CM1–CM6 stoiing the column address to be replaced with two column addresses, corresponding to first replacement determination unit 3100.1 to sixth replacement determination unit 3100.6.

A row address storage unit RM1 and a column address storage unit CM1 are provided corresponding to first replacement determination unit 3100.1 that corresponds to the above case 1, i.e. the process of carrying out replacement with a spare row two times continuously, and then carrying out replacement with a spare column two times continuously.

Row address storage unit RM1 includes a storage cell train CMR11 to store the address of the row to be replaced with the first spare row SR1, and a storage cell train MCR12 to store the address of the row to be replaced with the second spare row SR2.

Column address storage unit CM1 includes a storage cell train MCC11 to store the address of the column to be replaced with the first spare column SC1, and a storage cell train MCC1 to store the address of the column to be replaced with the second spare column SC2.

Since first replacement determination unit 3100.1 corresponds to the above case 1, determination is made whether the current internal address signal is to be written into the storage cell train at every activation of pass/fail signal P/F in the sequence of storage cell train MCR11, storage cell train MCR12, storage cell train MCC11, and storage cell train MCC12 in corresponding row address storage unit RM1 and column address storage unit CM1.

Charge circuits CPR11, CPR12, CPC11, CPC12 are provided corresponding to memory cell columns MCR11, MCR12, MCC11, MCC12. Each of precharge circuits CPR11–CPC12 precharge to an H level a match determination line MHL provided corresponding to storage cell trains MCR11–MCC12 according to a signal φ.

Memory cell columns MCR11 and MCR12 include a TG cell provided corresponding to the 14 sets of internal row address signals RA0, /RA0 to internal row address signals RA13, /RA13 to store the level of these signals.

Similarly, storage cell trains MCC11 and MCC12 include a TG cell provided corresponding to the sets of internal column address signals CA0, /CA0 to internal column address signals CA8, /CA8 to store the signal level of these signals.

The TG cell in row address storage unit RM1 and column address storage unit CM1 stores the level of a corresponding internal row address signal or internal column address signal in response to write activation line TWL attaining an active level (H level) according to designation from a corresponding first replacement determination unit 3100.1.

Match determination line MHL precharged to the H level maintains the H level when the level of the address signal already stored in the storage cell train matches the current level of internal address signals RA0, /RA0~RA13, /RA13 or internal column address signals CA0, /CA0~CA8, /CA8 applied to address replacement determinater 3000. When the levels of the address signals do not match, match determination line MHL is driven to an L level.

Also, flip-flop circuits SFR11, SFR12, SFC11, and SFC12 are provided corresponding to storage cell trains MCR11, MCR12, MCC11 and MCC12, respectively. Flip-flop circuits SFR11~SFC12 have their levels reset by a reset signal RST prior initiation of a test operation, and set in response to write select line TWL of the corresponding storage cell train attaining an active state (H level).

Second replacement determination unit 3100.2 are provided with a row address storage unit RM2 and a column address storage unit CM2 corresponding to the process of alternately carrying out replacement with a spare row and replacement with a spare column. Second replacement determination unit 3100.2 determines whether to write in the current internal address signal into the storage cell train at every activation of pass/fail signal P/F in the sequence of storage cell train MCR21, storage cell train MCC21, storage cell train MCR22 and storage cell train MCC22 in corresponding row address storage unit RM2 and column address storage unit CM2. The remaining structure is similar to that of first replacement determination unit 3100.1.

The same applies for the third to sixth replacement determination units 3100.3~3100.6, provided that the corresponding storage cell train and the sequence of writing into the storage cell train differ. The remaining structure is similar to that of replacement determination unit 3100.1, and description thereof will not be repeated.

According to the above structure, replacement determination unit 3100.1 operates as set forth in the following.

When pass/fail signal P/F is rendered active, first replacement determination unit 3100.1 renders write select line TWL of storage cell train MCR11 active. In response, the level of flip-flop circuit SFR11 corresponding to storage cell train MCR11 is set, and data is stored indicating that an address signal has been already written into this storage cell train MCR11.

When pass/fail signal P/F is rendered active again, respective TG cells carry out comparison between the internal row address signal stored in storage cell train MCR11 and the level of the current internal row address signal. The level of match detection line MHL of storage cell train MCR11 is driven according to the comparison result. When the internal row address stored in storage cell train MCR11 matches the internal row address corresponding to the newly detected defective memory cell, first replacement determination unit 3100.1 does not render storage cell train MCR12 active.

When the internal row address already stored in storage cell train MCR11 does not match the internal row address corresponding to the newly detected defective memory cell, first replacement determination unit 3100.1 renders active write select line TWL of storage cell train MCR12 that is to be the second activated storage cell train.

The internal row address corresponding to the newly detected defective memory cell is written into the second storage cell train MCR12, and the level of flip-flop circuit SFR12 corresponding to storage cell train MCR12 attains a set state.

In a similar manner, the internal row address or internal column address already stored in the storage cell train is compared with the internal row address or internal column address corresponding to the defective memory cell, every time a defective memory cell is newly detected. When the internal row addresses do not match, the corresponding storage cell train is rendered active according to the sequence of case 1 corresponding to first replacement determination unit 3100.1.

In contrast, when the internal row addresses match, first replacement determination unit 3100.1 does not render active the storage cell train corresponding to the next order.

Eventually, determination is made that all the defective memory cells can be replaced and repaired by replacing the defective memory cell with a spare row or a spare column in the sequence corresponding to first replacement determination unit 3100.1 when the internal row address and internal column address of all the defective memory cells that are sequentially detected match the internal row address or internal column address already stored in row address storage unit MR1 and column address storage unit CM1 during the check of the normal memory cell in the built-in test. The determination result is applied to address replacement determinater 3000 to BIST control unit 2010 as a repair fail signal RF.

A similar structure corresponding to first replacement determination unit 3100.1 and associated row and column address storage units RM1 and CM1 is provided corresponding to second replacement determination unit 3100.2 to sixth replacement determination unit 3100.6. Each replacement determination unit activates the storage cell train in the row address storage unit and the storage cell train in the column address storage unit along a corresponding sequence due to the correspondence of second replacement determination unit 3100.2—sixth replacement determination unit 3100.6 with cases 2–6, respectively.

If the defective memory cells in normal memory cell array 100R can be repaired by two spare rows and two spare columns as shown in FIG. 1, the repair fail signal RF from at least one of first replacement determination unit 3100.1 to sixth replacement determination unit 3100.6 maintains an inactive state (L level) even at the time when the last defective memory cell is detected.

Accordingly, BIST control unit 2010 reads out the internal row address signal and the internal column address signal stored in the row address storage unit and the column address storage unit corresponding to the replacement determination unit providing an inactive repair fail signal RF. According to the read out internal row address signal and internal column address signal, the row address and the column address to be repaired can be programmed with respect to spare row decoder 42 and spare column decoder 52.

Thus, there are 2×6=12 storage cell trains for row address units RM1–RM6. There are 2×6=12 storage cell trains for column address storage units CM1–RM6. Therefore, there are a total of 24 storage cell trains.

Figure 4:
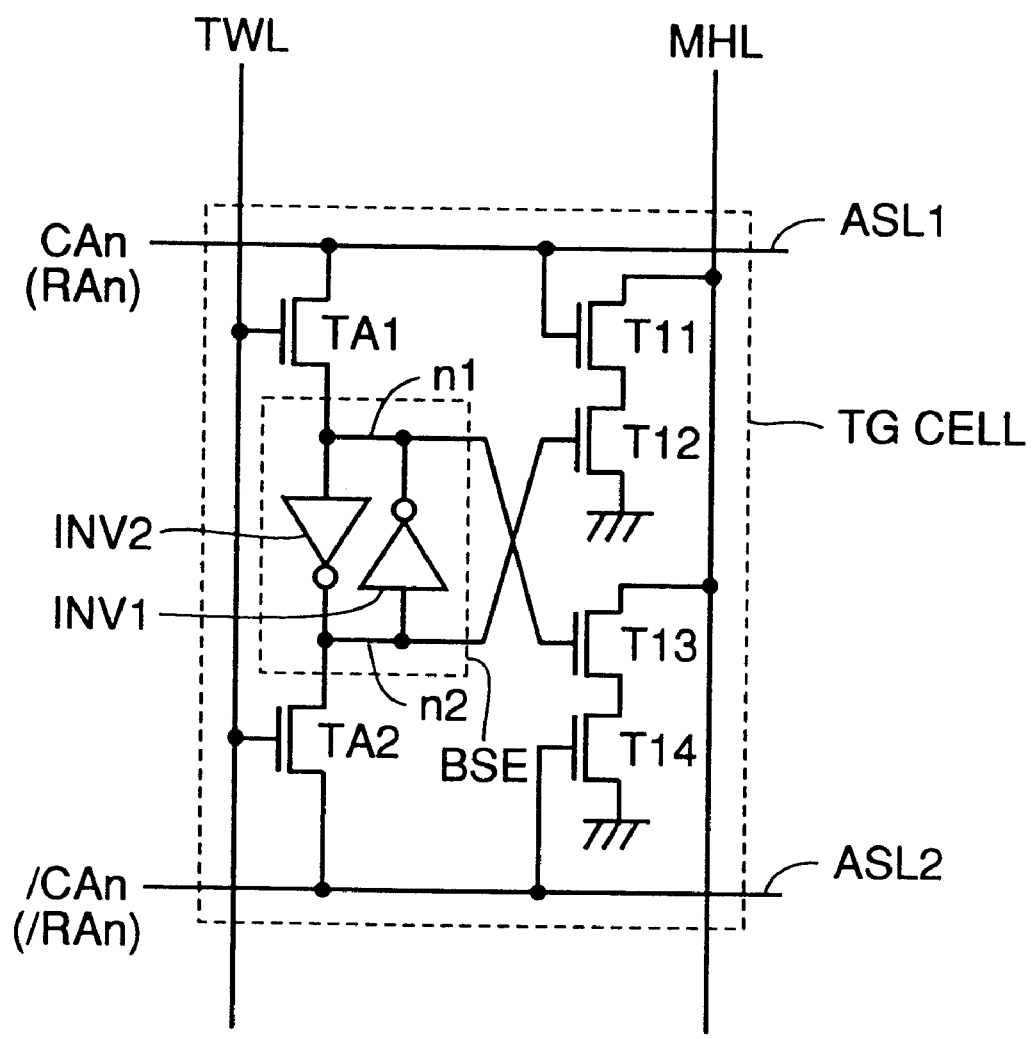
FIG. 4 is a circuit diagram showing a structure of a TG cell of FIG. 3.

FIG. 4 is a circuit diagram showing a structure of the TG cell of FIG. 3.

TG cell includes an address signal line ASL1 to transmit an internal column address signal CAn or an internal row address signal RAn (n: natural number; n=0–13 for RAn and n=0–8 for CAn), a storage element BSE formed of two inverters INV1 and INV2, an N channel type access transistor TA1 for connecting a storage node n1 of storage element BSE with address signal line ASL1 according to the level of signal line TWL, an address signal line ASL2 for transmitting an internal address signal /CAn or /RAn complementary to address signals CAn or RAn, an N channel type access transistor TA2 for connecting a storage node n2 of storage element BSE with address signal line ASL2 according to the level of signal line TWL, N channel transistors T11 and T12 connected in series between match detection line MHL and the ground potential, and transistors T13 and T14 connected in series between match detection line MHL and the ground potential.

Transistor T11 has its gate connected to address signal line ASL1. Transistor T12 has its gate connected to storage node n2 of storage element BSE.

Transistor T13 has its gate connected to storage node n1 of storage element BSE. Transistor T14 has its gate connected to address signal line ASL2.

More specifically, storage element BSE is connected to address signal lines ASL1 and ASL2 according to activation of write select line TWL. When the data stored in storage element BSE does not match the internal address signal on address signal lines ASL1 and ASL2, match detection line MHL is connected to the ground potential to be discharged via the path of transistors T11 and T12 or the path of transistors 13 and T14.

Figure 5:
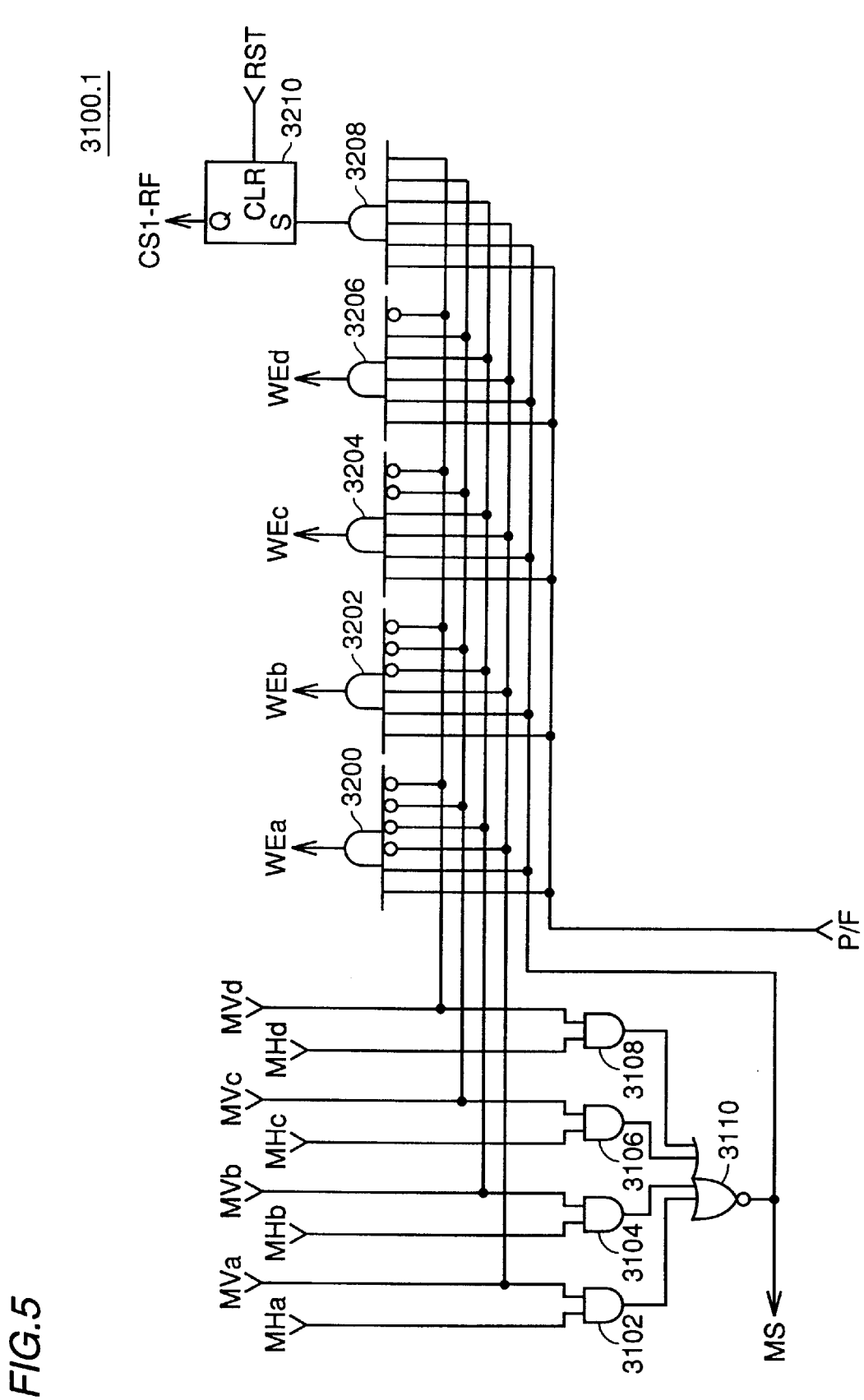
FIG. 5 is a schematic block diagram for describing a structure of a first replacement determination unit 3100.1 of FIG. 3.

FIG. 5 is a schematic block diagram for describing a structure of first replacement determination unit 3100.1 of FIG. 3.

The structure of second replacement determination unit 3100.2 to sixth replacement determination unit 3100.6 are basically similar, provided that the connected storage cell train differs.

First replacement determination unit 3100.1 includes an AND circuit 3102 having the input node connected with match detection line MHL of storage cell train MCR11 and the output of flip-flop circuit SFR11, an AND circuit 3104 having the input node connected with match detection line MHL of storage cell train MCR12 and the output of flip-flop circuit SFR12, an AND circuit 3106 having the input node connected with match detection line MHL of storage cell train MCC11 and the output of flip-flop circuit SFC11, an AND circuit 3108 having the input node connected with match detection line MHL of storage cell train MCC12 and the output of flip-flop circuit SFC12, and a 4-input NOR circuit 3110 receiving the outputs of AND circuits 3102–3108 to output a signal MS.

As to the input nodes of AND circuits 3102–3108 of first replacement determination unit 3100.1, the input nodes connected with match detection line MHL are represented as nodes MHa, MHb, MHc, MHd, and the input nodes connected with the output of flip-flop circuits SFR11–SFC12 are represented as nodes MVa, MVb, MVc, MVd.

First replacement determination unit 3100.1 further includes a logic gate 3200 receiving an inverted signal of the level of node MVa, the inverted signal of the level of node MVb, the inverted signal of the level of node MVc, the inverted signal of the level of node MVd, signal MS, and pass/fail signal P/F to output the logical product of these signals as a write select signal WEa that is applied to write select line TWL of storage cell train MCR11, a logic gate 3202 receiving a signal of the level of node MVa, the inverted signal of the level of node MVb, the inverted signal of the level of node MVc, the inverted signal of the level of node MVd, signal MS, and pass/fail signal P/F to output the logical product of these signals as a write select signal WEc that is applied to write select line TWL of storage cell train MCR12, a logic gate 3204 receiving the signal of the level of node MVa, the signal of the level of node MVb, the inverted signal of the level of node MVc, the inverted signal of the level of node MVd, signal MS, and pass/fail signal P/F to output the logical product of these signals as a write select signal WEc that is applied to write select line TWL of storage cell train MCC11, and a logic gate 3206 receiving the signal of the level of node MVa, a signal of the level of node MVb, a signal of the level of node MVc, an inverted signal of the level of node MVd, signal MS, and pass/fail signal P/F to output a logical product of these signals as a write select signal WEd that is applied to write select line TWL of storage cell train MCC12.

First replacement determination unit 3100.1 further includes a 6-input AND circuit 3208 receiving a signal of the level of node MVa, a signal of the level of node MVb, a signal of the level of node MVc, a signal of the level of node MVd, signal MS, and pass/fail signal P/F to output a logical product of these signals, and a flip-flop circuit 3210 reset according to reset signal RST and set according to the output of AND circuit 3208 to provide a repair fail signal CS1–RF for case 1.

The operation of address replacement determinater 3000 of FIG. 3 will be described in further detail.

Figure 6:
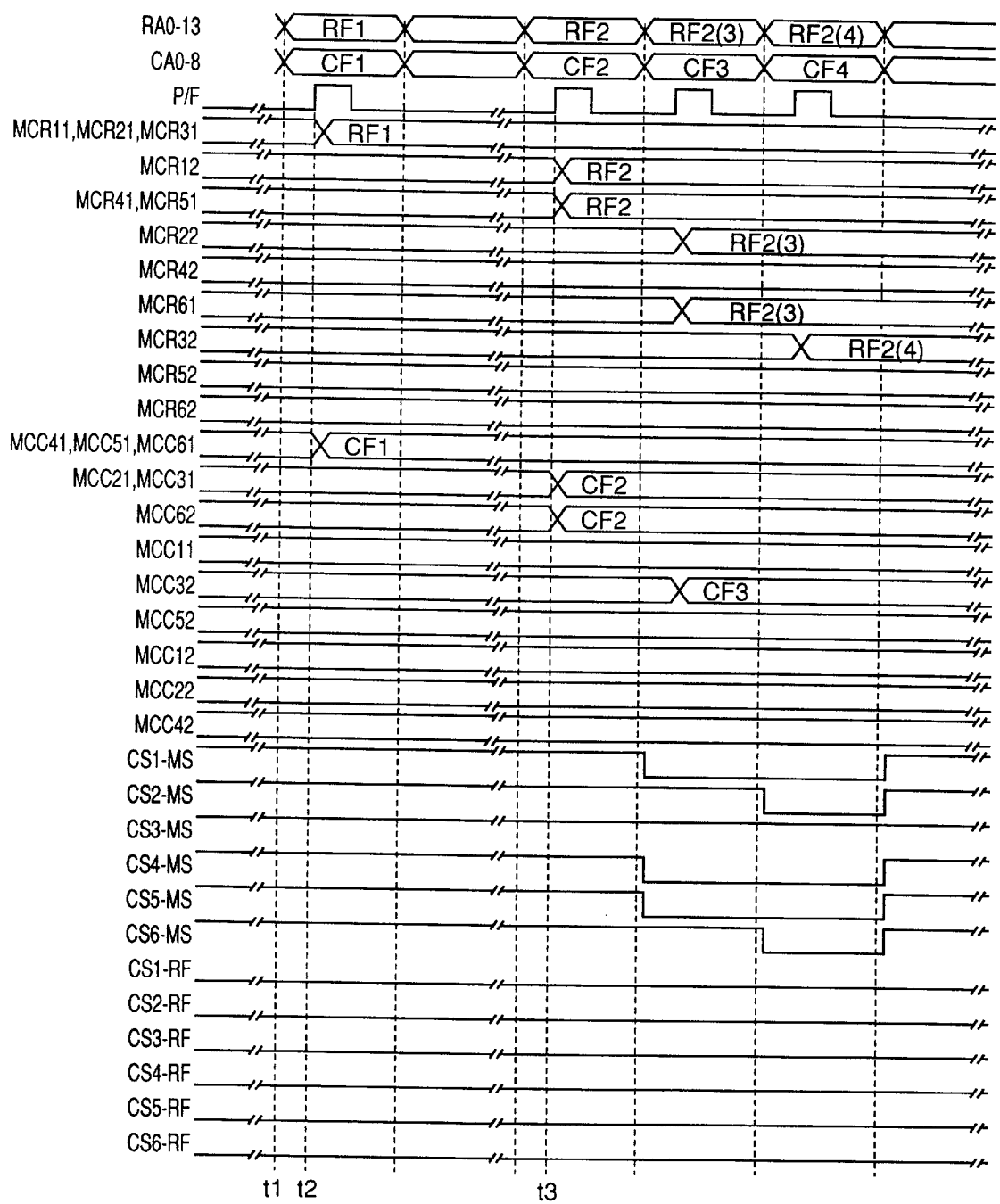
FIGS. 6 and 7 are timing charts for describing an operation of address replacement determinater 3000.
Figure 7:
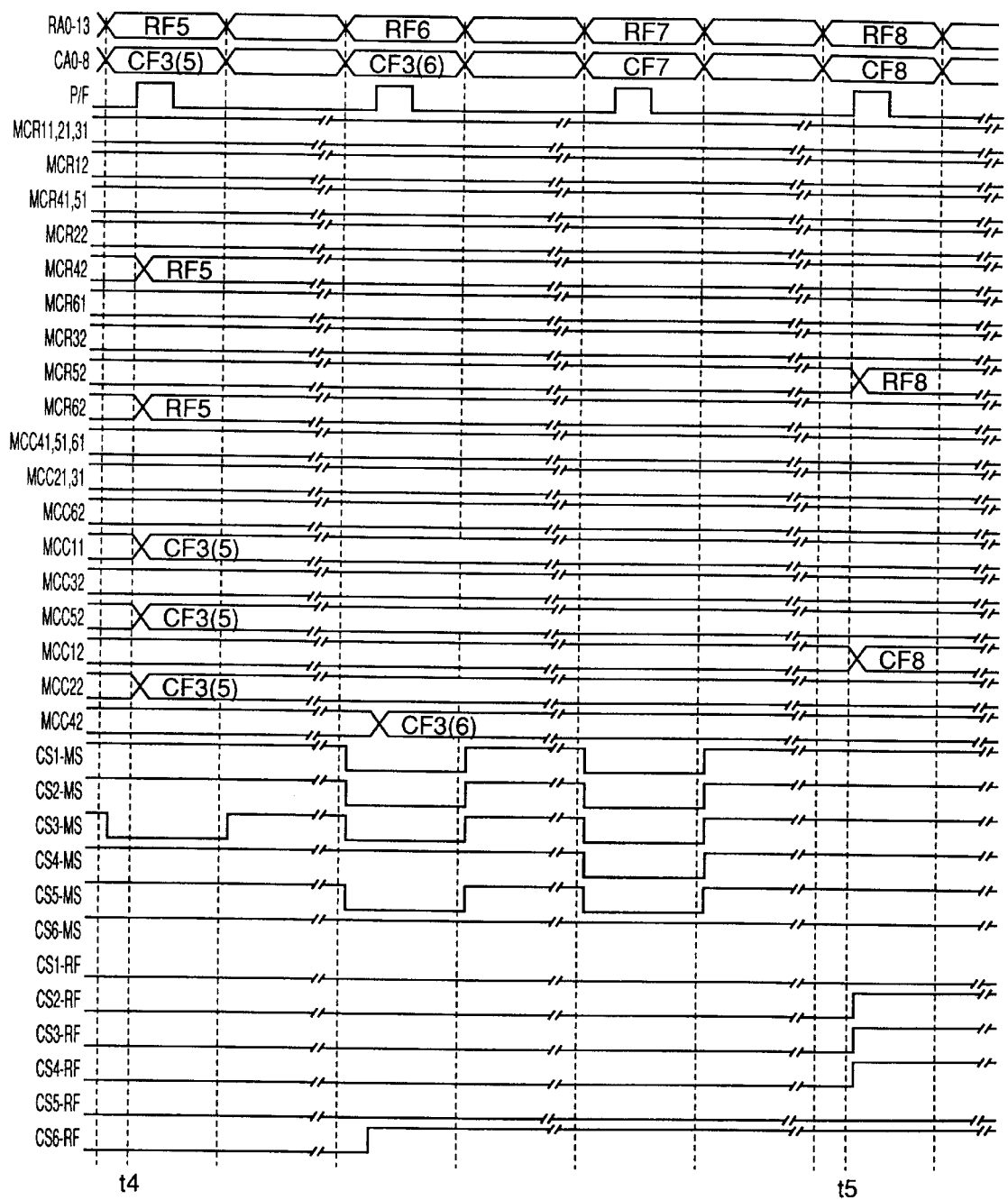

FIGS. 6 and 7 are timing charts for describing an operation of address replacement determinater 3000.

The following description corresponds to the case where a defective memory cell is defected in the sequence of defective memory cells DBM1–DBM8 shown in FIG. 19.

Although not shown in FIG. 6, reset signal RST is rendered active to effect a clear operation for all the flip-flops prior to testing. Also, match determination line MHL is precharged to the H level according to signal φ prior to each match determination operation.

The operation of first replacement determination unit 3100.1 and the operation of storage cell trains MCR11, MCR12, MCC11 and MCC12 connected thereto will be described here.

As mentioned before, first replacement determination unit 3100.1 corresponds to the process of replacing a detected defective memory cell according to the sequence of spare row→spare row→spare column→spare column.

Referring to FIG. 6, the MS node (corresponds to signal CS1-MS in FIG. 6) of first replacement determination unit 3100.1 is at an H level since nodes MVa, MVb, MVc and MVd all are at an L level, i.e. all the values of storage cell trains MCR11, MCR12, MCC11 and MCC12 are not yet written at time t1.

At time t2 when a defective memory cell DBM1 is detected and signal P/F is rendered active (H level), write select signal WEa for storage cell train MCR11 attains an H level, whereby row address RF1 of defective memory cell DBM1 is written into storage cell train MCR11.

At the next detection of defective memory cell DBM2, node MVa is at an H level according to the signal from flip-flop circuit SFR11 corresponding to storage cell train MCR11. However, node MHa does not attain an H level since the value stored in storage cell train MCR11 does not match the row address of defective memory cell DBM2. In response to the MS node of first replacement determination unit 3100.1 attaining an H level and signal P/F attaining an H level at time t3, write select signal WEb corresponding to storage cell train MCR12 is driven to an H level, whereby row address RF2 of defective memory cell DBM2 is written into storage cell train MCR12.

At the next detection of defective memory cell DBM3, the MS node of first replacement determination unit 3100.1 attains an L level since the row address already stored in storage cell train MCR12 matches the row address of defective memory cell DBM3. Therefore, writing into storage cell train MCC11 is not carried out since write select line WEc corresponding to storage cell train MCC11 remains at the L level.

Similarly in the detection of defective memory cell DBM4, the internal address will not be written into storage cell train MCC11 since the MS node is at an L level.

At time t4 where defective memory cell DBM5 is detected as represented in FIG. 7, none of the internal row address and internal column address already stored in the storage cell train match the internal address of defective memory cell DBM5. Therefore, the internal column address of defective memory cell DBM5 is written into storage cell train MCC11.

At respective detections of defective memory cells DBM6 and DBM7, the column address already stored in storage cell train MCC11 matches the column address of defective memory cells DBM6 and DBM7. Therefore, write select signal WEd towards storage cell train MCC12 is not rendered active, and the internal address is not written into storage cell train MCC12.

At time t5 when defective memory cell DBM8 is detected, the column address of defective memory cell DBM8 does not match the internal address already stored in memory cell columns MCR11, MCR12, MCC11. Therefore, column address CF8 of defective memory cell DBM8 is written into storage cell train MCC12.

Even when all the defective memory cells in the memory array have been detected (at the time of test completion), the output level of flip-flop circuit 3210 of first replacement determination unit 3100.1 is not set by the above operation.

The operations of second replacement determination unit 3100.2—sixth replacement determination unit 3100.6 are similar to that of first replacement determination unit 3100.1, provided that the connected storage cell train and the sequence of row or column determination differ from those of first replacement determination unit 3100.1.

Also, it is to be noted that the address written into each memory cell column and whether the output of flip-flop circuit 3210 is set or not at the time of detecting the eighth defective memory cell DMB8 differ according to each replacement determination unit.

When the test ends, BIST control unit 2010 reads out repair fail signal RF corresponding to the value of flip-flop circuit 3210 in first replacement determination unit 3100.1 to sixth replacement determination unit 3100.6. The value stored in the storage cell train connected to any of first to sixth replacement determination units 3100.1–3100.6 having a repair fail signal RF of an L level and that holds a valid value, i.e. the storage cell train corresponding to any of nodes MVa, MVb, MVc, and MVd having an H level, represents the address to be replaced. In the above example, a replacement process by a spare row and a spare column is to be carried out according to the address stored in the storage cell train corresponding to first replacement determination unit 3100.1 or the value stored in the storage cell train connected to fifth replacement determination unit 3100.5.

In the above-described structure of BIST circuit 2000, the circuit scale can be suppressed at a low level even if the memory capacity of the under-measurement semiconductor memory device is increased. Thus, there is the advantage that incorporation into a semiconductor memory device is facilitated.

The above description is provided corresponding to two spare rows and two spare columns. However, the number of spare rows and spare columns are not limited to 2. When the number of the spare rows and spare columns is increased, a replacement determination unit corresponding to the number of the increased combinations is to be provided. Also, a row address storage unit and a column address storage unit corresponding thereto are to be provided.

The first embodiment is described corresponding to a structure in which BIST circuit 2000 is provided in a semiconductor memory device. The present invention is not limited to this application. For example, in the case where a semiconductor memory device is integrated together with, for example, a logic circuit on one chip, a structure can be implemented in which BIST circuit 2000 is provided to test this semiconductor memory device.

Second Embodiment

The previous first embodiment corresponds to a structure in which BIST circuit 2000 by which defective memory cell detection and redundancy analysis are carried out is built-in semiconductor memory device 1000.

In the present second embodiment, a replacement address determination circuit 3000 of the BIST circuit is provided, not in semiconductor memory device 8000, but in an external tester. Semiconductor memory device 8000 is subjected to testing and redundancy analysis under control of this tester.

Figure 8:
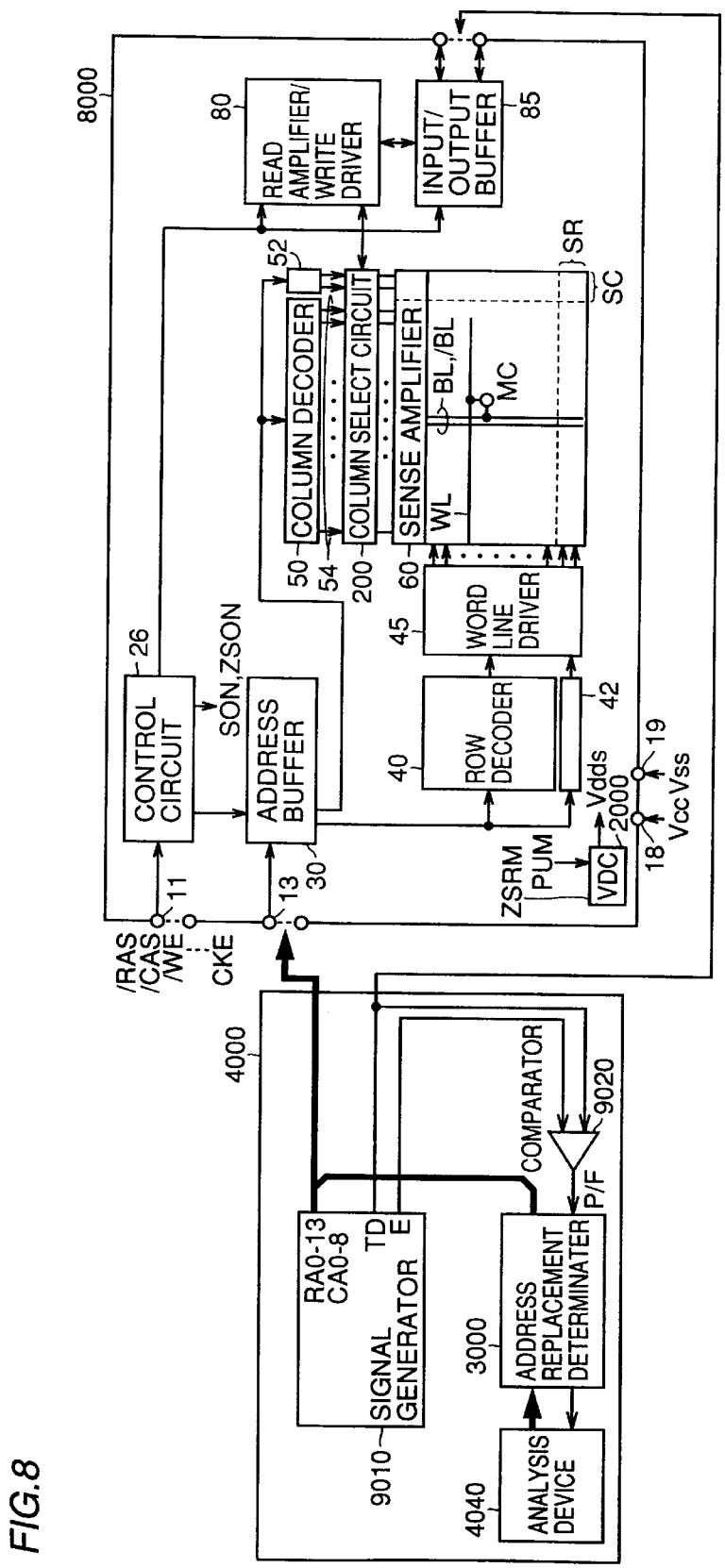
FIG. 8 is a schematic block diagram showing a structure of a tester 4000 according to a second embodiment of the present invention.

FIG. 8 is a schematic block diagram showing a structure of a tester 4000 according to the second embodiment of the present invention.

Figure 20:
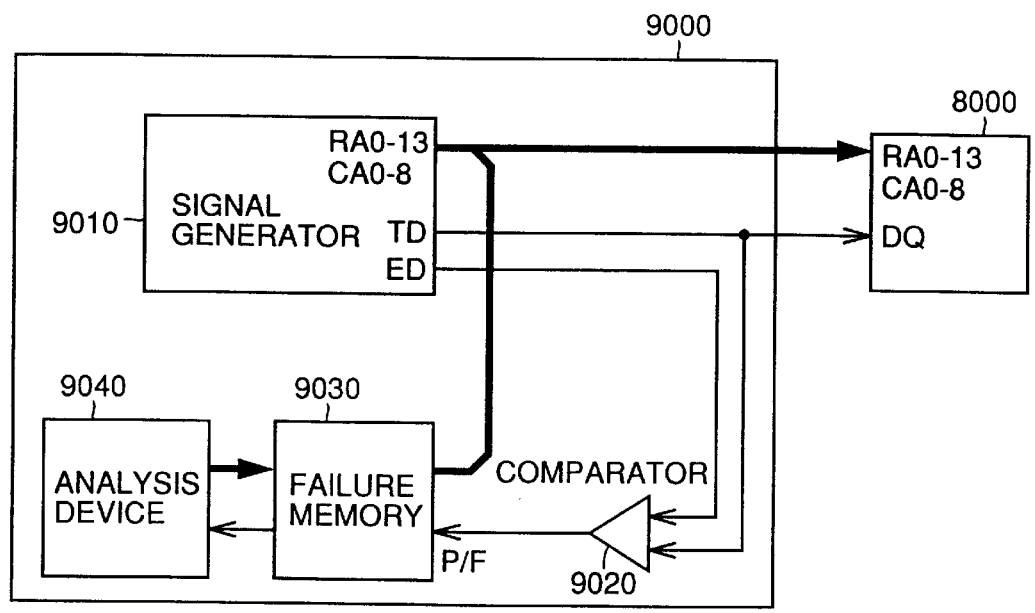
FIG. 20 is a schematic block diagram showing the structure of a memory tester 9000.

Tester 4000 of FIG. 8 corresponds to tester 9000 shown in FIG. 20 with address replacement determinater 3000 of the first embodiment provided instead of failure memory 9030. Reflecting facilitation of the analysis process, analysis device 9040 is replaced with an analysis device 4040.

The other elements are similar to those of the conventional tester 9000 shown in FIG. 20. Corresponding elements have the same reference characters allotted, and description thereof will not be repeated. The structure of semiconductor memory device 8000 is similar to that of DRAM 1000 of the first embodiment, provided that BIST 2000 is absent. Corresponding components have the same reference characters allotted, and description thereof will not be repeated.

In a test operation, tester 4000 applies address signals RA0–13 and CA0–8 to semiconductor memory device 8000. Signal generator 9010 applies internal address signals RA0–13, /RA0–13, CA0–8, /CA0–8 to address replacement determinater 3000.

In a write operation, signal generator 9010 provides test data TD to semiconductor memory device 8000. In a read out operation, comparator 9020 compares expected value data ED from signal generator 9010 with data RD read out from semiconductor memory device 8000 to provide a pass/fail signal P/F to address replacement determinater 3000 according to the comparison result.

According to the above structure, memory tester 4000 of the second embodiment can have defective memory cell detection and redundancy analysis carried out by address replacement determinater 3000 of a circuit scale smaller than that of failure memory 9030 of the conventional memory tester 9000. Therefore, there is an advantage that, when the memory capacity of the under-measurement semiconductor memory device is increased, increase in the cost corresponding to the larger capacity is small.

Third Embodiment

Address replacement determinater 3000 shown in FIG. 3 of the first embodiment has a structure in which 4 sets of storage cell trains are provided corresponding to each of the first to sixth replacement determination units 3100.1–3100.6.

However, there are several groups of storage cell trains MCR11, MCR12, ~MCR61, MCR62 and memory cell columns MCC11, MCC12~MCC61, MCC62 that has the stored data change completely identical to that of another storage cell train, as apparent from the operation of address replacement determinater 3000 described with reference to FIGS. 6 and 7.

The present third embodiment takes advantage of this feature to reduce the number of storage cell trains and relax the circuit complexity, and provides an address replacement determinater 5000 that operates likewise address replacement determinater 3000 of the first embodiment.

In order to understand the above operation, the change of the stored information in the storage cell train will be described for each step of the replacement process of respective cases 1–6.

FIG. 9 is a systematic diagram for describing the change of the state of each storage cell train in respective cases 1–6.

In the i-th case (i: natural number and any of 1–6), the replacement process carried out at the j-th step (j: natural number and any of 1–4) is represented as $X_{ij}$, where X is R when replacement with the row spare is carried out and C when replacement with a spare column is carried out in FIG. 9.

In case 1, for example, the process carried out at step 1 of case 1 is $R_{11}$ since replacement with a spare row is carried out at step 1. The same applies to the other cases and other replacement process steps.

As mentioned in the previous first embodiment, the characteristic conditions set forth in the following must be satisfied in order to write an address into a storage cell train into which an internal address is not yet written when a defective memory cell is sequentially detected to sequentially write an internal address signal into an appropriate storage cell train.

Attention is focused on a storage cell train corresponding to a certain replacement determination unit. When a defective memory cell having a row address or column address identical to any one of the row address or column address of a defective memory cell already stored is newly detected, writing an internal address to the storage cell train is not carried out. Only when a defective memory cell corresponding to an address differing from that already stored in the storage cell train is detected, the process proceeds to the next step, whereby the internal address signal is written into the storage cell train.

This means that an address signal written at a certain step will not be rewritten in the subsequent steps. More specifically, attention is focused on the j-th step. The process before that j-th step is determined according to what address the detected defective memory cell has. The previous processes (storage of address of defective memory cell) carried out up to the j-th step will not be affected by the subsequent processes.

In the cases where replacement with a spare row and replacement with a spare column are carried out in the same sequence at steps prior to the j-th step, the stored data in the storage cell trains corresponding to the steps prior to the j-th step in each case change according to the same course. Therefore, the same defective address will be stored in those storage cell trains.

In example shown in FIG. 9, replacement with a spare row is carried out at each step 1 of cases 1–3. Therefore, the stored information in the storage cell train corresponding to the processes of $R_{11}$–$R_{31}$ corresponding to step 1 of cases 1–3 is completely identical irrespective of the course of the subsequent processes.

The stored address value in the storage cell train corresponding to processes $C_{41}$–$C_{61}$ carried out at each step 1 of cases 4–6 is completely identical irrespective of the course of the subsequent processes.

Similarly for step 2, the defective address value stored in the storage cell train corresponding to the processes of $C_{21}$ and $C_{32}$ in cases 2 and 3 follows the identical course independent of the subsequent processes.

The same applies for the storage cell train corresponding to processes $R_{42}$ and $R_{52}$ of step 2 in cases 4 and 5.

In view of the foregoing, the storage cell trains corresponding to processes $R_{11}$–$R_{31}$ at step 1 of cases 1–3 can be set common. Also, the storage cell trains corresponding to processes $C_{41}$–$C_{61}$ corresponding to step 1 in cases 4–6 can be set common.

Similarly, the storage cell trains corresponding to processes $C_{22}$ and $C_{32}$ in step 2 of cases 2–3 can be set common. Also, the same storage cell train can be used corresponding to the process of step 2 in cases 4 and 5.

By effecting the allocation shown in FIG. 9 such as R1 for the storage cell train corresponding to processes $R_{11}$–$R_{31}$ and C1 for the storage cell train corresponding to processes $C_{41}$–$C_{61}$, only nine storage cell trains R1–R9 are required for the row address storage unit. Also, only nine storage cell trains of C1–C9 are required for the column address storage unit.

Respective relationship can be summarized as follows.
Storage Cell Train R1: Processes $R_{11}$, $R_{21}$, $R_{31}$
Storage Cell Train C1: Processes $C_{41}$, $C_{51}$, $C_{61}$
Storage Cell Train R2: Process $R_{12}$
Storage Cell Train C2: Processes $C_{22}$, $C_{32}$,
Storage Cell Train R3: Processes $R_{42}$, $R_{52}$
Storage Cell Train C3: Process $C_{62}$ Storage Cell Train C4: Process $C_{13}$
Storage Cell Train R4: Process $R_{23}$
Storage Cell Train C5: Process $C_{33}$
Storage Cell Train R5: Process $R_{43}$
Storage Cell Train C6: Process $C_{33}$
Storage Cell Train R6: Process $R_{63}$
Storage Cell Train C7: Process $C_{14}$
Storage Cell Train C8: Process $C_{24}$
Storage Cell Train R7: Process $R_{34}$
Storage Cell Train C9: Process $C_{44}$
Storage Cell Train R8: Process $R_{54}$
Storage Cell Train R9: Process $R_{64}$ It is therefore possible to reduce the number of storage cell trains in the third embodiment than that of the first embodiment.

Figure 10:
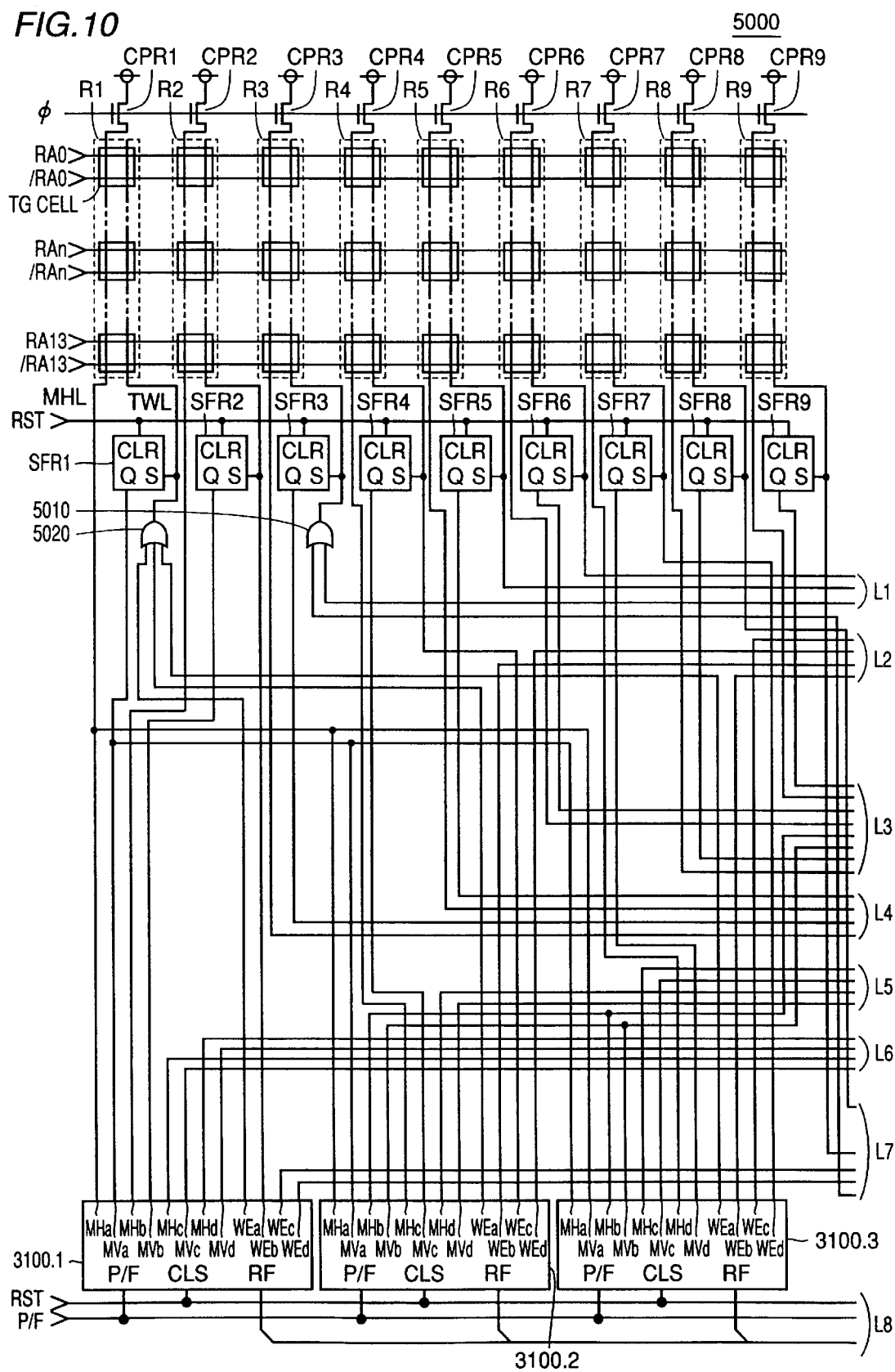
FIGS. 10 and 11 are schematic block diagrams showing the left half and right half, respectively, of an address replacement determinater 5000 according to a third embodiment of the present invention.
Figure 11:
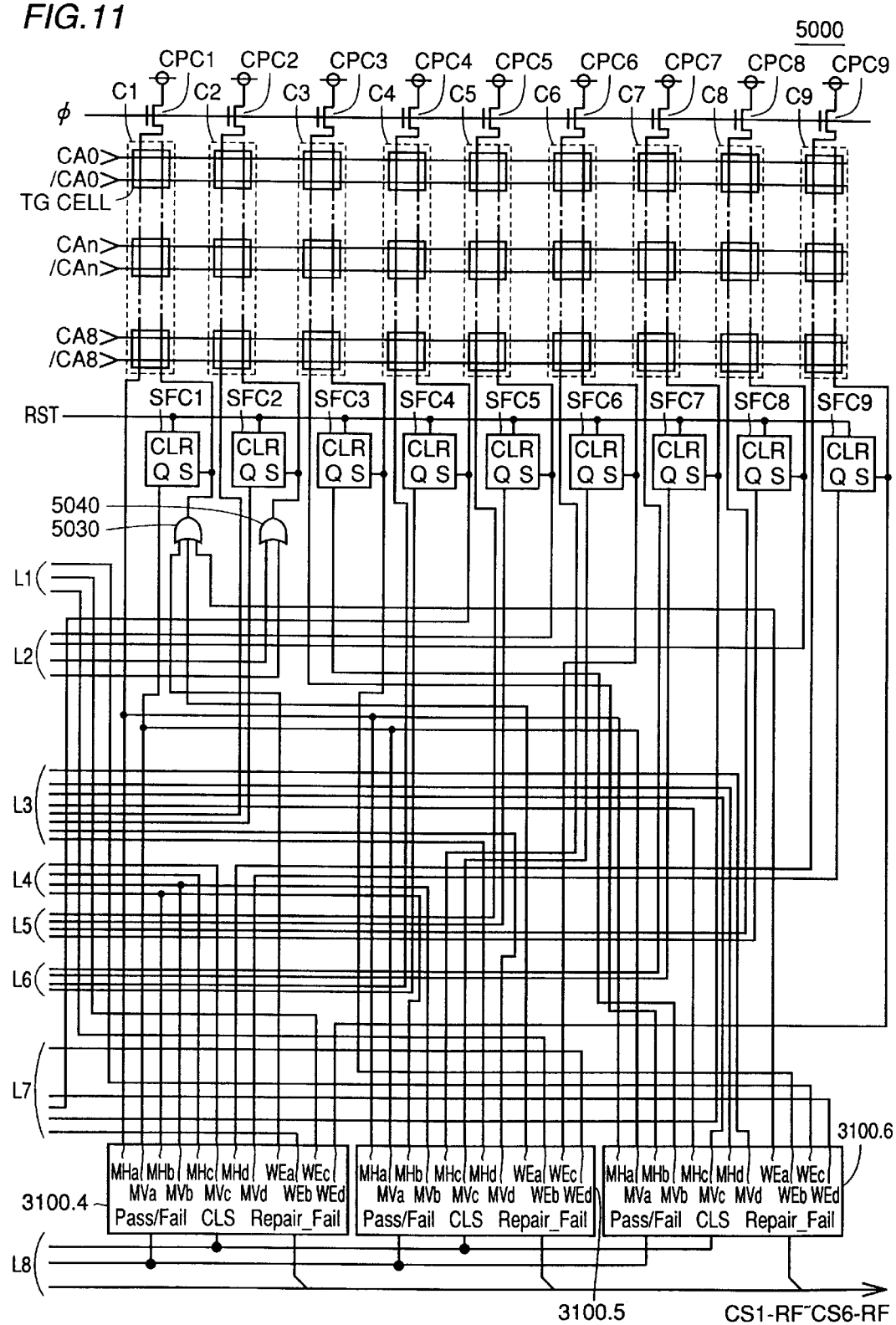

FIGS. 10 and 11 show a structure of address replacement determinater 5000 of the third embodiment, comparable to the structure of address replacement determinater 3000 of the first embodiment shown in FIG. 3.

FIGS. 10 and 11 show the plane structure of the left half and the right half, respectively, of address replacement determinater 5000. For the sake of convenience, corresponding lines in the left half plane and the right half plane have the same reference characters L1–L7 allotted, indicating that these lines join at the boundary of FIGS. 10 and 11.

Storage cell trains R1 and R9 are provided in the row address storage unit and storage cell train C1–C9 are provided in the column address storage unit.

In order to allow storage cell train R1 to be used in common in the process of step 1 in cases 1–3, output signal WEa from first replacement determination unit 3100.1, second replacement determination unit 3100.2 and third replacement determination unit 3100.3 is applied to an OR circuit 5010, and the output from OR circuit 5010 is applied to write select line TWL of storage cell train R1 to allow the common usage of storage cell train R1.

Similarly, in order to allow storage cell train R3 to be used in common in processes $R_{42}$ and $R_{52}$ of cases 4 and 5, signal WEb from fourth replacement determination unit 3100.4 and fifth replacement determination unit 3100.5 is applied to an OR circuit 5020, and the output from OR circuit 5020 is applied to write select line TWL of storage cell train R3.

In order to allow storage cell train C2 to be used in common in the process of step 1 in cases 4–6, output signal WEa from fourth replacement determination unit 3100.4, fifth replacement determination unit 3100.5 and sixth replacement determination unit 3100.6 is applied to an OR circuit 5030 from which the output thereof is applied to write select line TWL of storage cell train C1.

Similarly, in order to allow storage cell train C2 to be used in common in processes $C_{22}$ and $C_{32}$ of cases 2 and 3, signal WEb from second replacement determination unit 3100.4 and third replacement determination unit 3100.3 is applied to an OR circuit 5040 from which the output thereof is applied to write select line TWL of storage cell train C2.

The remaining elements are similar to those of address replacement determinater 3000 of the first embodiment. Corresponding components have the same reference characters allotted, and description thereof will not be repeated.

By virtue of the above structure, the an operation similar to that of address replacement determinater 3000 of the first embodiment can be realized with a smaller circuit scale.

Figure 12:
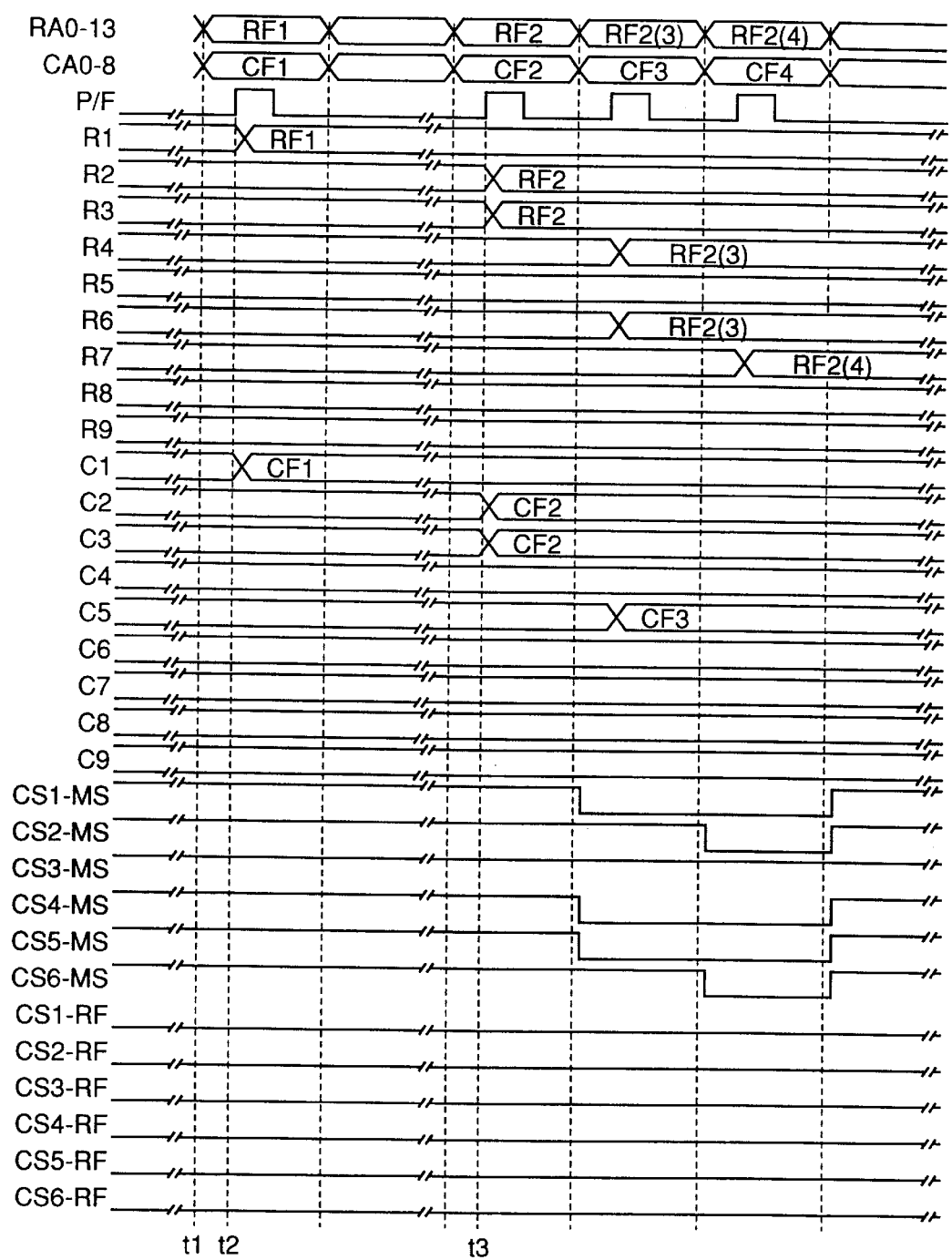
FIGS. 12 and 13 are timing charts for describing an operation of address replacement determinater 5000.
Figure 13:
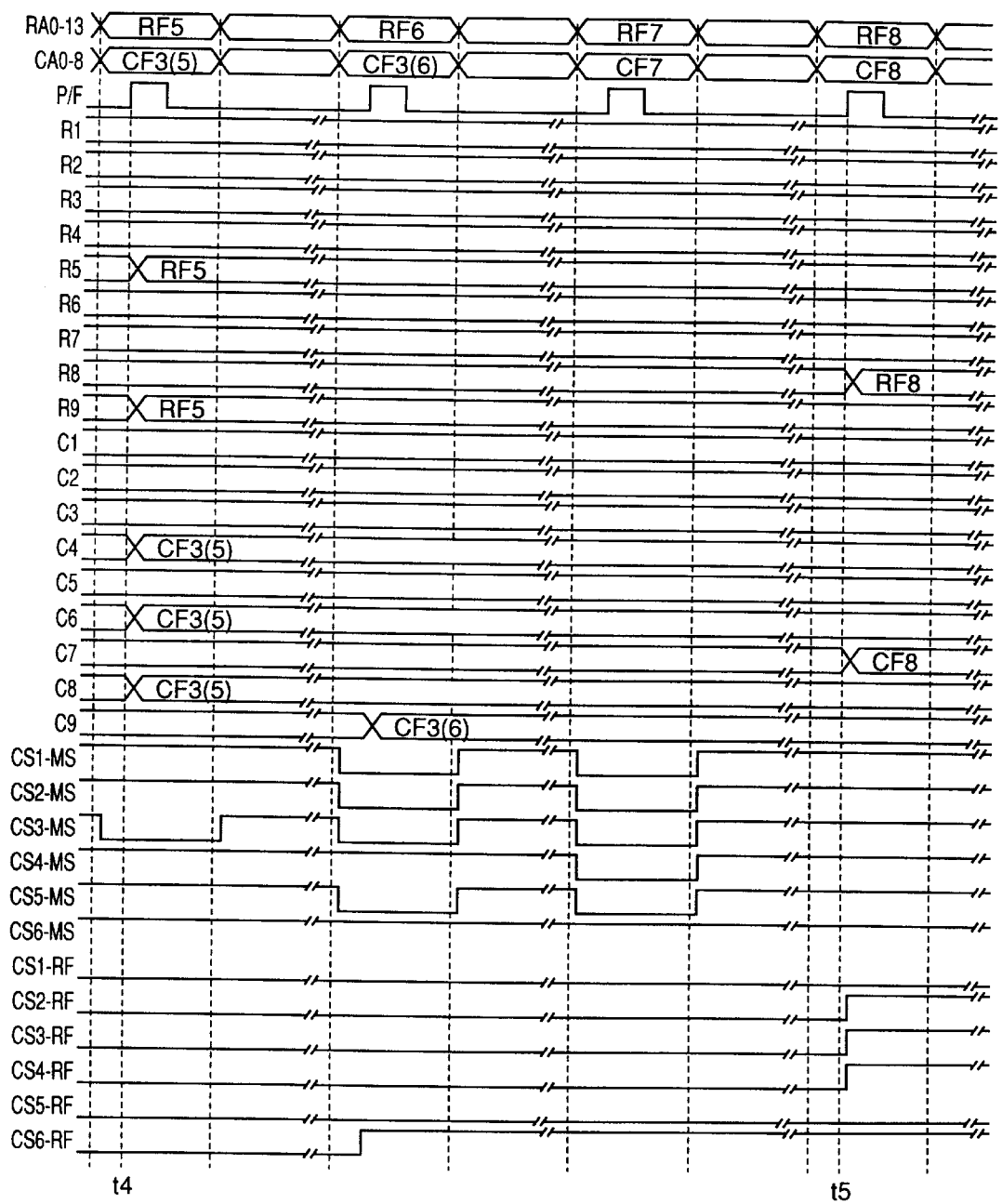

FIGS. 12 and 13 are timing charts for describing the operation of address replacement determinater 5000 of FIGS. 10 and 11.

The following description corresponds to the case where a defective memory cell is detected in the sequence of defective memory cells DBM1–DBM8 of FIG. 19.

Although not shown in FIG. 12, reset signal RST to clear all the flip-flops is rendered active prior to the test. Also, match determination line MHL is precharged to an H level according to signal φ prior to each match determination operation.

The operation of first replacement determination unit 3100.1 and connected storage cell trains R1, R2, C4 and C7 will be described here.

First replacement determination unit 3100.1 corresponds to the process of replacing a detected defective memory cell according to the sequence of spare row→spare row→spare column→spare column, as mentioned before.

At time t1 in FIG. 12, the MS node of first replacement determination unit 3100.1 (corresponding to signal CS1-MS in FIG. 12) is at an H level since nodes MVa, MVb, MVc, MVd are all at an L level, i.e. all the values of storage cell trains R1, R2, C4, C7 have not yet been written.

When defective memory cell DBM1 is detected and pass/fail signal P/F is rendered active (H level) at time t2, write select signal WEa for storage cell train R1 attains an H level, whereby row address RF1 of defective memory cell DBM1 is written into storage cell train R1.

At the next detection of defective memory cell DBM2, node MHa is not driven to an H level since the address stored in storage cell train R1 does not match the row address of defective memory cell DBM2 despite node MVa attaining an H level according to the signal from flip-flop circuit SFR1 corresponding to storage cell train R1. In response to first replacement determination unit 3100.1 attaining an H level and signal P/F attaining an H level at time t3, write select signal WEb corresponding to storage cell train R2 attains an H level, whereby row address RF2 of defective memory cell DBM2 is written into storage cell train R2.

When defective memory cell DBM3 is detected, the MS node of first replacement determination unit 3100.1 attains an L level since the row address already stored in storage cell train R2 matches the row address of defective memory cell DBM3. Therefore, no writing into storage cell train C4 is carried out since write select signal WEc corresponding to storage cell train C4 remains at an L level.

Similarly when defective memory cell DBM4 is detected, the internal address is not written into storage cell train C4 since the MS node is at an L level.

At time t4 when defective memory cell DBM5 is detected as represented in FIG. 13, the internal column address of defective memory cell DBM5 is written into storage cell train C4 since the internal address of defective memory cell DBM5 does not match any of the internal row address and internal column address stored in the corresponding storage cell train.

When defective memory cells DBM6 and DBM7 are detected, write select signal WEd for storage cell train C7 is not rendered active and the internal address is not written into storage cell train C7 since the column address already recorded in storage cell train C4 matches the column addresses of defective memory cells DBM6 and DBM7.

At time t5 when defective memory cell DBM8 is detected, column address CF8 of defective memory DBM8 is written into storage cell train C7 since the column address of defective memory cell DBM8 does not match the internal address signals already stored in storage cell trains R1, R2 and C4.

Even when all the defective memory cells in the memory array have been detected (at the time of test completion), the level of signal CS1-RF output from flip-flop circuit 3210 of first replacement determination unit 3100.1 is not set by the above operation.

The operations of second replacement determination unit 3100.2—sixth replacement determination unit 3100.6 are similar to that of first replacement determination unit 3100.1, provided that the connected storage cell train and the sequence of row or column determination differ from those of first replacement determination unit 3100.1.

Also, it is to be noted that the address written into each storage cell train and whether the output of flip-flop circuit 3210 is set or not at the time of detecting the eighth defective memory cell DMB8 differ according to each replacement determination unit.

When the test ends, BIST control unit 2010 reads out repair fail signal RF corresponding to the value of flip-flop circuit 3210 in first replacement determination unit 3100.1 to sixth replacement determination unit 3100.6. The value stored in the storage cell train connected to any of first to sixth replacement determination units 3100.1–3100.6 having a repair fail signal RF of an L level and that holds a valid value, i.e. the storage cell train corresponding to any of nodes MVa, MVb, MVc, and MVd having an H level, represents the address to be replaced. In the above example, a replacement process with a spare row and a spare column is to be carried out according to the address stored in the storage cell train corresponding to first replacement determination unit 3100.1 or the value stored in the storage cell train connected to fifth replacement determination unit 3100.5.

In the above-described structure of the BIST circuit, the circuit scale can be suppressed at a low level even if the memory capacity of the under-measurement semiconductor memory device is increased. Thus, there is the advantage that incorporation into a semiconductor memory device is facilitated.

The third embodiment is described corresponding to a structure in which a BIST circuit is provided in a semiconductor memory device. The present invention is not limited to this application. For example, in the case where a semiconductor memory device is integrated together with, for example, a logic circuit on one chip, a structure can be implemented in which a BIST circuit is provided to test this semiconductor memory device.

The above description is provided corresponding to two spare rows and two spare columns. However, the number of the spare rows and spare columns are not limited to 2. When the number of spare rows and spare columns is increased, a replacement determination unit corresponding to the number of the increased combinations is to be provided. Also, a row address storage unit and a column address storage unit corresponding thereto are to be provided.

Figure 14:
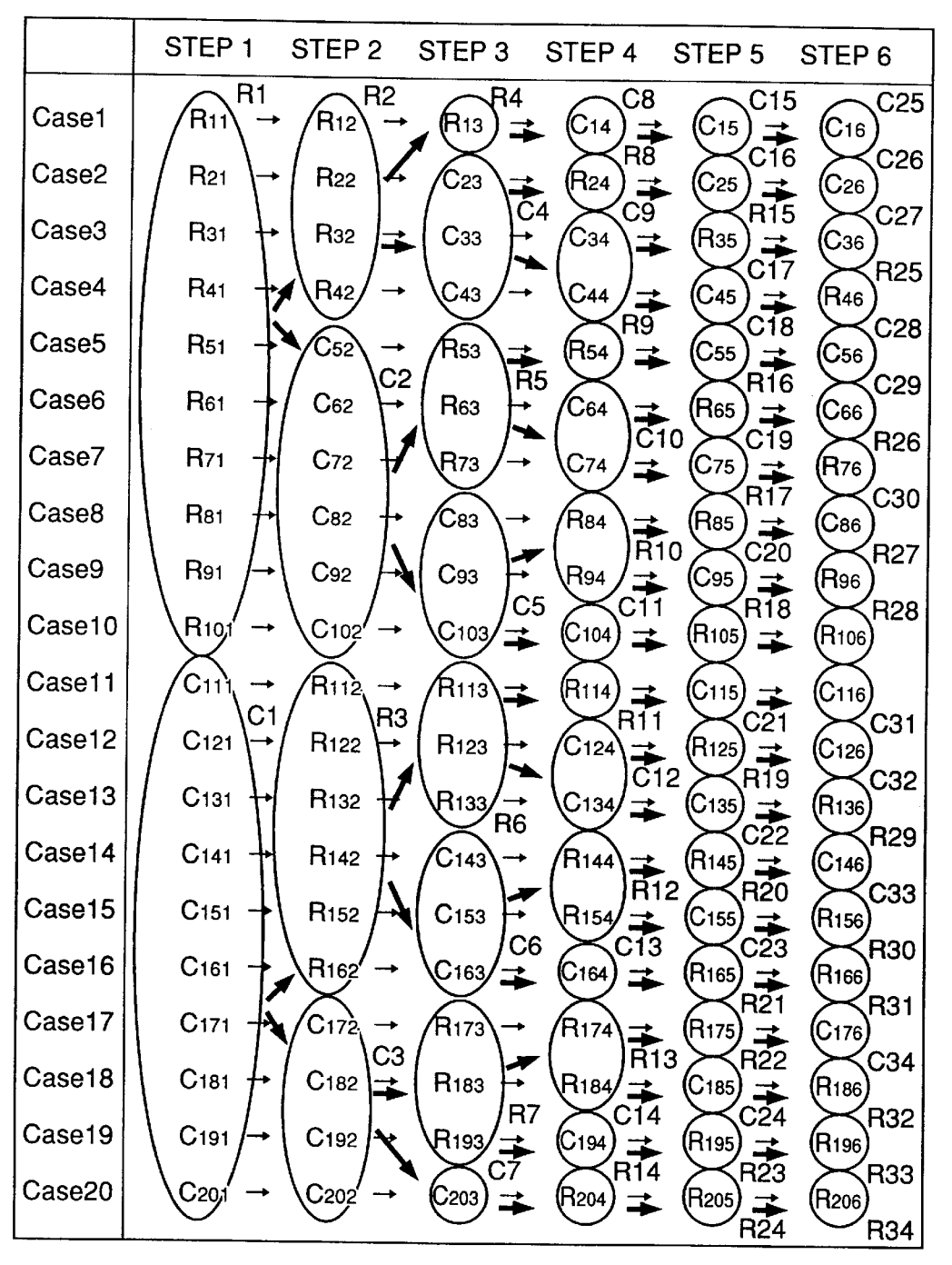

By way of example, a systematic diagram for three spare rows and three spare columns corresponding to that of FIG. 9 is shown in FIG. 14.

Since there are three spare rows and three spare columns, the total number of replacement steps is 6. The sequence of the replacement process includes the combinations of $_{(3+3)}C_3=20$ types.

If a structure similar to that of the first embodiment is applied, 20 replacement determination units and 6×20=120 storage cell trains will be required.

However, by implementing the process as in the third embodiment, only 34 storage cell trains R1–R34 are required for the row address storage unit and only 34 storage cell trains C1–C34 are required for the column address storage unit. The total number of the storage cell trains can be reduced to 64.

In general, the number of the storage cell trains can be similarly reduced when there are m spare rows and n spare columns.

Also, address replacement determiner 5000 can be used in the tester instead of address replacement determination circuit 3000 of the second embodiment.

Fourth Embodiment

Figure 15:
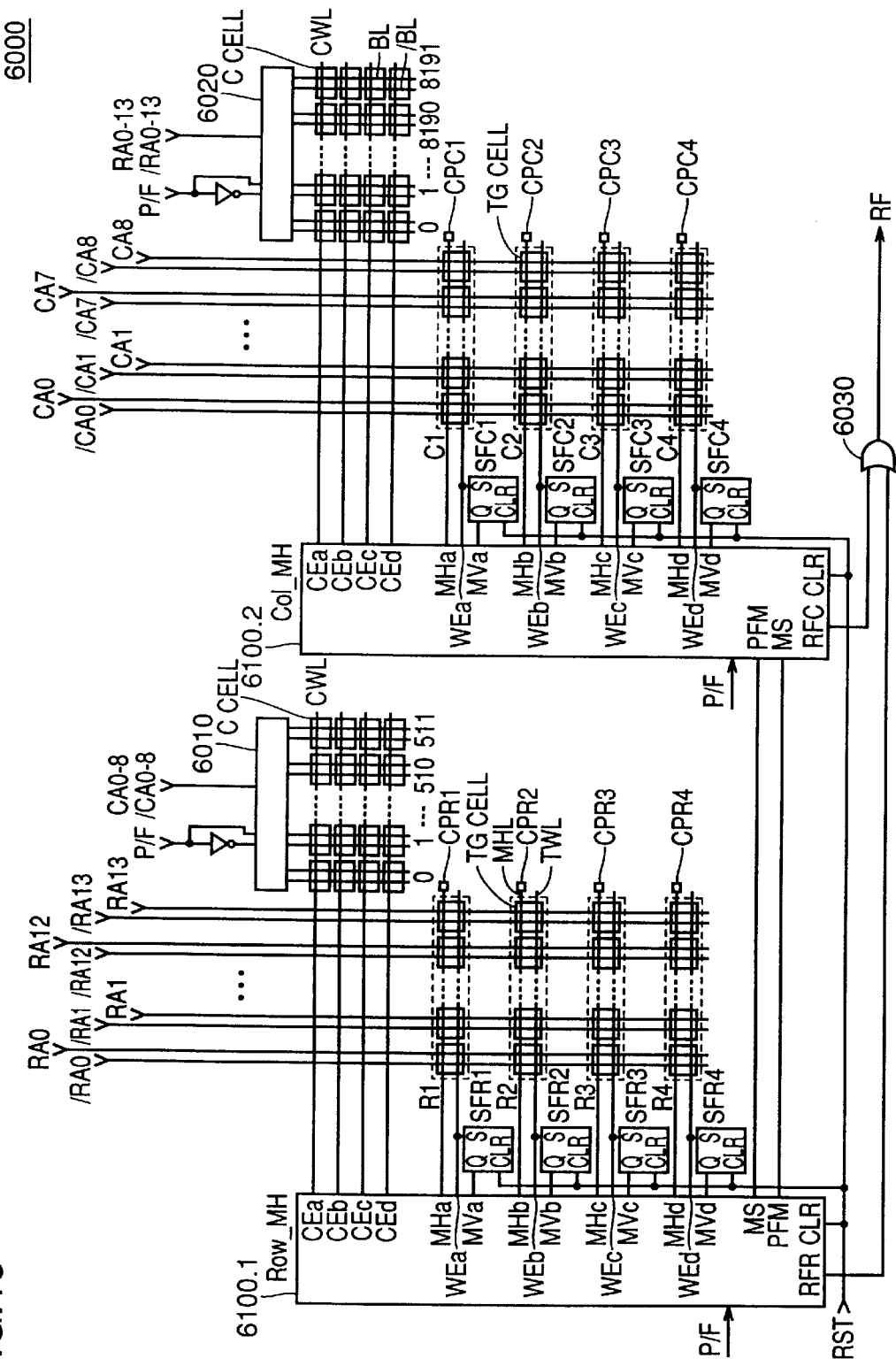
FIG. 15 is a schematic block diagram showing a structure of an address replacement determinater 6000 according to a fourth embodiment of the present invention.

FIG. 15 is a schematic block diagram showing a structure of an address replacement determiner 6000 according to the fourth embodiment of the present invention.

Address replacement determiner 6000 can be replaced with address replacement determiner 3000 of the first embodiment. Address replacement determiner 6000 of FIG. 15 can be used in the tester instead of address replacement determination circuit 3000 of the second embodiment.

Address replacement determiner 6000 of FIG. 15 corresponds to the case of analyzing a semiconductor memory device including two spare rows and two spare columns.

Each of storage cell trains R1–R4 and C1–C4 has a structure similar to that of storage cell trains R1–R9 and storage cell trains C1–C9 of the third embodiment.

Also, each of flip-flop circuits SFR1~SFR4, SFC1~SFC4 in FIG. 15 is similar to that of flip-flop circuits SFR1~SFR9 or SFC1~SFC9 of the third embodiment.

Figure 16:
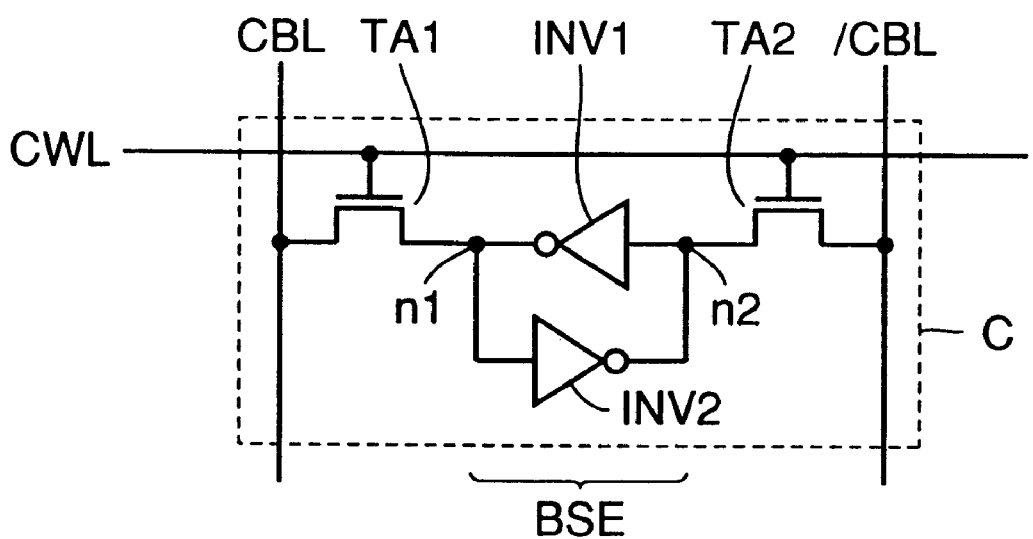
FIG. 16 is a schematic block diagram showing a structure of each C cell.

FIG. 16 is a schematic block diagram showing a structure of each C cell in FIG. 15. The C cell of FIG. 15 is a memory cell having a structure similar to that of a normal SRAM, as shown in FIG. 16. More specifically, when word line CWL is at an H level, access transistors TA1 and TA2 are rendered conductive, whereby the value of bit line CBL and the value of complementary bit line /CBL are stored in storage element BSE. Storage element BSE includes two inverters INV1 and INV2 having each input node and output node connected to each other.

Referring to FIG. 15 again, the first C cell array of 4 rows×512 columns is provided at the spare row side. The second C cell array of 4 rows×8192 columns is provided at the spare column side.

First column decoder 6010 connects one set from the 512 sets of bit line pair CBL, /CBL of the first C cell array of 4 rows×512 columns (spare row side) selected by column address signals CA0–8 generated by test signal generator 2020 shown in FIG. 2 with signal P/F output from comparator 2060 and an inverted output thereof.

Second column decoder 6020 connects one set from the 8192 sets of bit line pair CBL, /CBL of the second C cell array of 4 rows×8192 columns (spare column side) with signal P/F output from comparator 2060 and the inverted signal thereof.

Address replacement determiner 6000 further includes a row replacement determination unit 6100.1 provided corresponding to storage cell trains R1–R4 and the first C cell array, a column replacement determination unit 6100.2 provided corresponding to storage cell trains C1–C4 and the second C cell array, and an OR circuit 6030 receiving a row repair fail signal RFR from row replacement determination unit 6100.1 and a column repair fail signal RFC from column replacement determination circuit 6100.2 to generate a repair fail signal RF.

Figure 17:
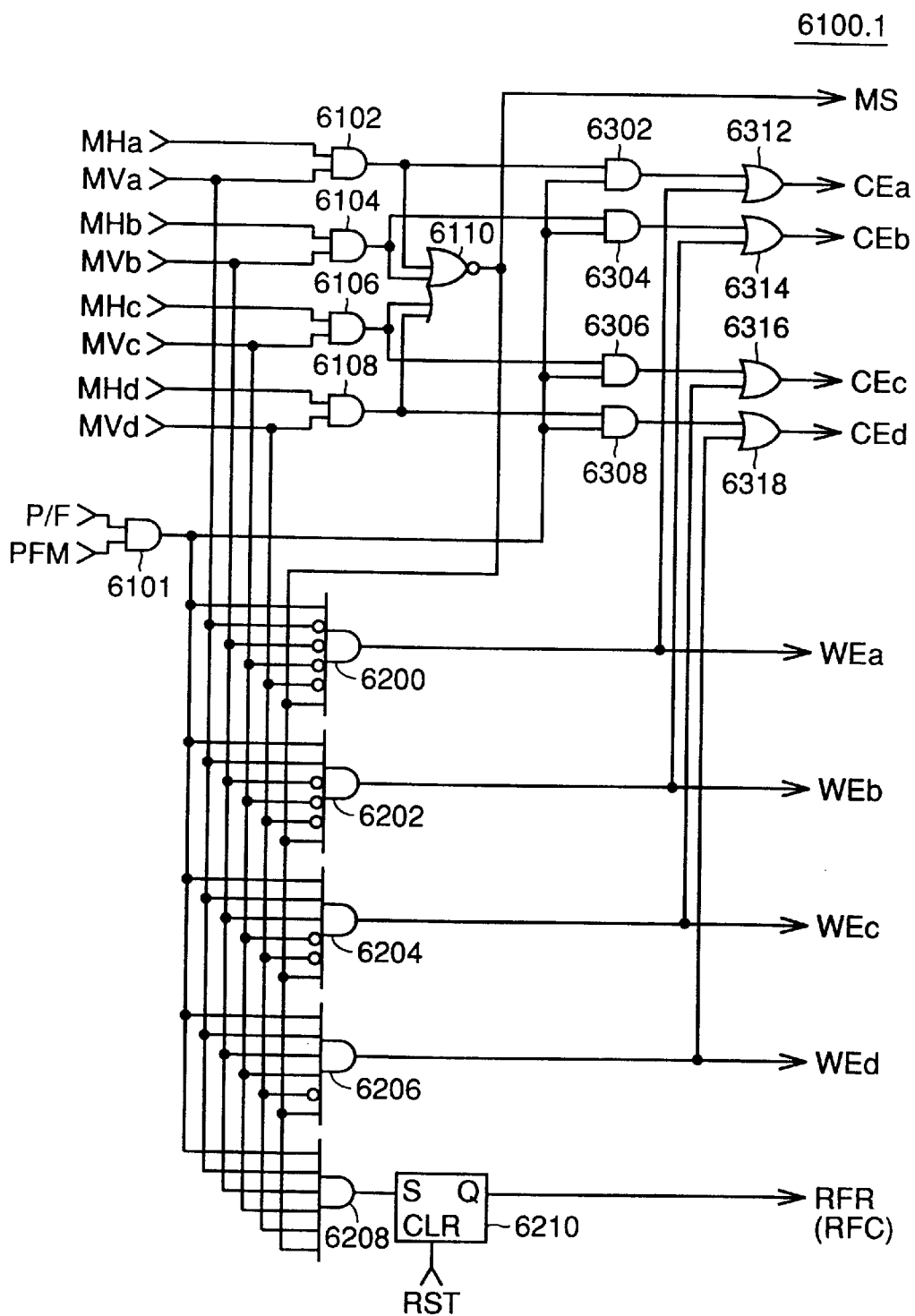
FIG. 17 is a schematic block diagram for describing a structure of a row replacement determination unit 6100.1 of FIG. 15.

FIG. 17 is a schematic block diagram for describing a structure of row replacement determination unit 6100.1 of FIG. 15. The structure of column replacement determination unit 6100.2 is basically similar.

Row replacement determination unit 6100.1 includes an AND circuit 6101 receiving pass/fail signal P/F and a miss signal MS from column replacement determination unit 6100.2, an AND circuit 6102 having the input node connected to match detection line MHL of storage cell train R1 and the output of flip-flop circuit SFR1, an AND circuit 6104 having the input node connected with match detection line MHL of storage cell train R2 and the output of flip-flop circuit SFR2, an AND circuit 6106 having the input node connected with match detection line MHL of storage cell train R3 and the output of flip-flop circuit SFR3, an AND circuit 6108 having the input node connected with match detection line MHL of storage cell train R4 and the output of flip-flop circuit SFR4, and a 4-input NOR circuit 6110 receiving the outputs of AND circuits 6102–6108 to output signal MS.

As to the input nodes of AND circuits 6102–6108 of row replacement determination unit 6100.1, the input node connected with match detection line MHL is represented as respective nodes MHa, MHb, MHc, MHd, and the input node connected with the output of flip-flop circuits SFR1–SFR4 is represented by respective nodes MVa, MVb, MVc, MVd.

Row replacement determination unit 6100.1 further includes a logic gate 6200 receiving an inverted signal of the level of node MVa, an inverted signal of the level of node MVb, an inverted signal of the level of node MVc, an inverted signal of the level of node MVd, signal MS, and the output signal from AND circuit 6101 to output the logical product of these signals as a write select signal WEa applied to write select line TWL of storage cell train R1, a logic gate 6202 receiving a signal of the level of node MVa, an inverted signal of the level of node MVb, an inverted signal of the level of node MVc, an inverted signal of the level of node MVd, signal MS and the output signal of AND circuit 6101 to provide the logical product of these signals as a write select signal WEb applied to write select line TWL of storage cell train R2, a logic gate 6204 receiving a signal of the level of node MVa, an signal of the level of node MVb, an inverted signal of the level of node MVc, an inverted signal of the level of node MVd, signal MS and the output signal of AND circuit 6101 to provide the logical product of these signals as a write select signal WEc applied to write select line TWL of storage cell train R3, and a logic gate 6206 receiving a signal of the level of node MVa, a signal of the level of node MVb, a signal of the level of node MVc, an inverted signal of the level of node MVd, signal MS, and the output signal of AND circuit 6101 to provide the logical product of these signals as a write select signal WEd applied to write select line TWL of storage cell train R4.

Row replacement determination unit 6100.1 further includes a 6-input AND circuit 6208 receiving a signal of the level of node MVa, a signal of the level of node MVb, a signal of the level of node MVc, a signal of the level of node MVd, signal MS, and the output signal of AND circuit 6101 to output a logical product, and a flip-flop circuit 6210 reset according to reset signal RST and set according to an output of AND circuit 6208 to provide a row repair fail signal RFR (column repair fail signal RFC in column replacement determination circuit 6100.2).

Row replacement determination unit 6100.1 further includes an AND circuit 6302 receiving an output signal of AND circuit 6102 and an output signal of AND circuit 6101, an AND circuit 6304 receiving the output signals of AND circuits 6104 and 6101, an AND circuit 6306 receiving the output signals of AND circuits 6106 and 6101, and an AND circuit 6308 receiving output signals of AND circuits 6108 and 6101.

Row replacement determination unit 6100.1 further includes an OR circuit 6312 receiving the output signal from AND circuit 6302 and signal WEa to output a signal CEa, an OR circuit 6314 receiving the output signal from AND circuit 6304 and signal WEb to output a signal CEb, an OR circuit 6316 receiving the output signal from AND circuit 6306 and signal WEc to output a signal CEc, and an OR circuit 6318 receiving the output signal from AND circuit 6308 and signal WEd to output a signal CEd.

Signals CEa, CEb, CEc, CEd are applied to the word line of the first row to fourth row of C cells out of the first C cell array.

Figure 18A:
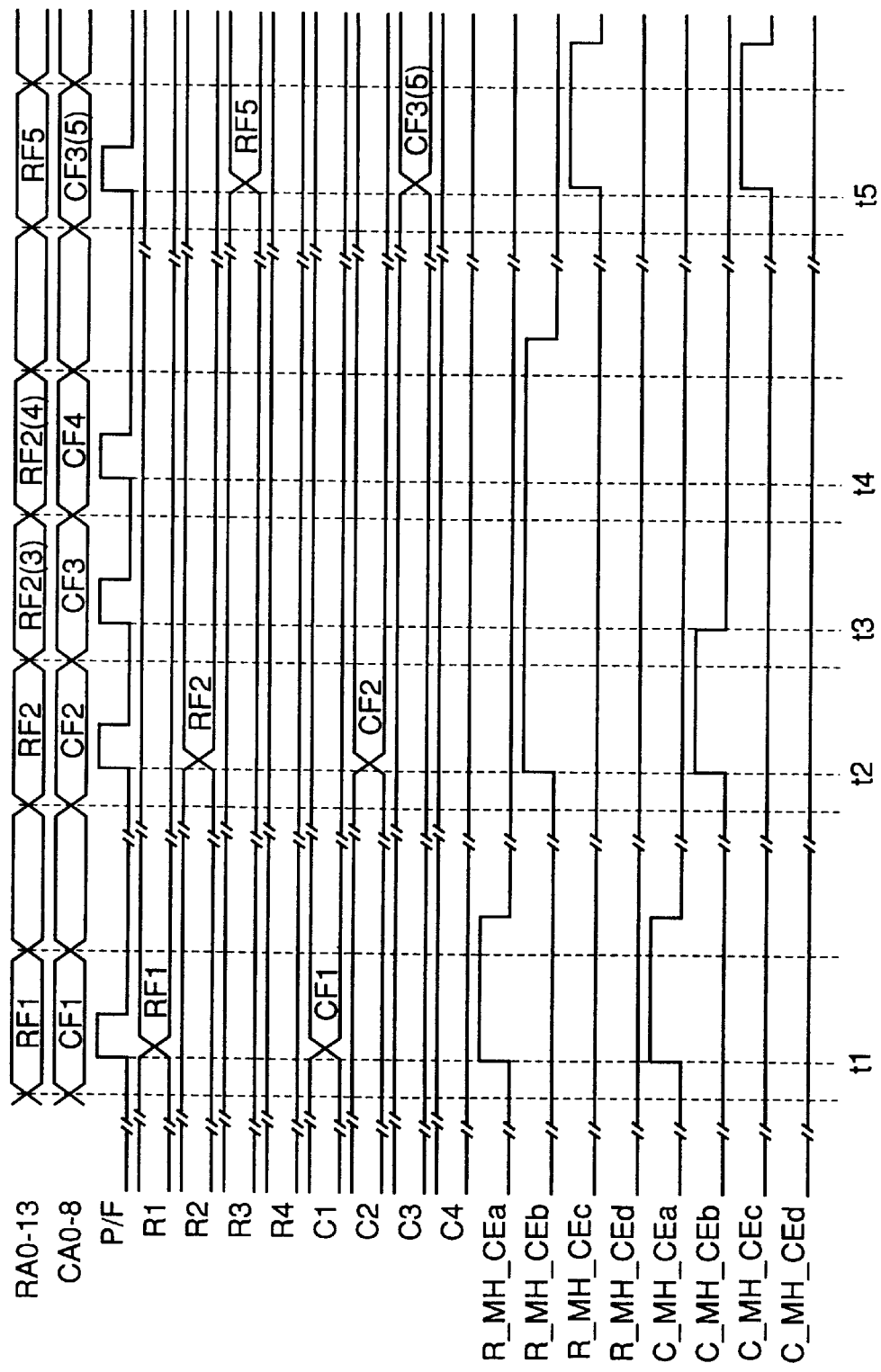

FIGS. 18A and 18B are timing charts for describing an operation of address replacement determinater 6000 of FIG. 15.

Although not shown, all the flip-flops must be cleared prior to the test operation. Also, the value of the L level must be written into all the C cells.

When the test is initiated and defective memory cell DBM1 is detected, pass/fail signal P/F attains an H level at time t1. Signal WEa of row replacement determination unit 6100.1 is pulled up to an H level, whereby row address RF1 of defective memory cell DBM1 (row address RF1, column address CF1) is written into storage cell train R1. Also, signal CEa of row replacement determination unit 6100.1 (signal R-MH-CEa in FIGS. 18A and 18B) attains an H level, whereby the value of the H level is written into the C cell of the CF1 column at the first row out of the 4 rows×512 columns of the C cells.

Also, signal WEa of column replacement determination unit 6100.2 attains an H level, whereby column address CF1 of defective memory cell DBM1 is written into storage cell train C1. Signal CEa of column replacement determination unit 6100.2 (signal C-MH-CEa in FIGS. 18A and 18B) attains an H level, whereby the value of the H level is written into the C cell of the RF1 column in the first row out of the 4 rows×8192 columns of the C cells.

Similarly when defective memory cell DBM2 is detected (row address RF2, column address CF2), pass/fail signal P/F is rendered active at time t2, whereby row address RF2 is written into defective memory cell DBM2 into storage cell train R2, and the value of the H level is written into the C cell of the CF2 column at the second row of the 4 rows×512 columns (spare row side). Also, column address CF2 of defective memory cell DBM2 is written into storage cell train C2, and the value of the H level is written into the C cell of the RF2 column at the second row in the 4 rows×8192 columns of cells (spare row side).

When defective memory cell DBM3 is detected (row address RF3, column address CF3), the row address stored in storage cell train R2 matches the row address of defective memory cell DBM3. Therefore, signals WEa, WEb, WEc and WEd remain at the L level, so that the address is not written into storage cell train R3.

Also, signal MS from row replacement determination unit 6100.1 attains an L level, whereby signal PFM to column replacement determination unit 6100.1 is pull down to an L level. Therefore, the address is not written into storage cell train C3. However, the value of the H level is written into the C cell at the CF3 column in the second row in the 4×512 cells.

When defective memory cell DBM4 is detected, no addresses will be written into storage cell trains R3 and C3. However, the value of the H level is written into the C cell of the CF4 column at the second row in the 4×512 cells (spare row side).

When defective memory cell DBM5 is detected (row address RF5, column address CF5), pass/fail signal P/F attains an active state at time t3. Row address RF5 of defective memory cell DBM5 is written into storage cell train R3, and the H level value is written into the C cell of the CF5 (=CF3) column at the third row in the 4×512 cells (spare row side). Also, column address CF5 of defective memory cell DBM5 is written into storage cell train C3, and the H level value is written into the C cell of the RF5 column at the third row of the 4 rows×8192 column of cells (spare column side).

Detection of defective memory cells DBM6–DBM8 is carried out in a manner identical to that of any of defective memory cells DBM1–DBM3.

In the case where the under-measurement semiconductor memory device can be repaired, the address of all the defective memory cells can be identified by reading out R1–4, C1–4, output value Q of the flip-flop and the value of the C cell from address replacement determinater 6000 by means of BIST control unit 2010 after the test is completed. BIST control unit 2010 determines whether the under-measurement semiconductor memory device can be repaired or not from the addresses of the defective memory cells. Accordingly, the address to be replaced can be programmed in spare row decoder 42 and spare column decoder 52. There is an advantage that incorporation into the semiconductor memory device is facilitated by virtue of the small circuit scale of address replacement determinater 6000.

In the case where address replacement determinater 6000 is applied to the memory tester, analysis device 4040 can send the address of the memory cell to be repaired to the repair device when the test is completed.

The memory cell including address replacement determinater 6000 of the fourth embodiment is smaller in circuit scale than the failure memory of the conventional memory tester. There is an advantage that, even when the memory capacity of the under-measurement semiconductor memory device is increased, increase of cost corresponding to the larger memory capacity is small due to the small circuit scale.

The fourth embodiment is described corresponding to the case of two spare rows and two spare columns. Accordingly, four storage cell trains R1–R4 and four storage cell trains C1–C4 are required at the row side and the column side, respectively, in order to store the addresses of (2+2) memory cells to be replaced in the structure of FIG. 15. This can be accommodated, how many the spare rows and columns there may be, by increasing the number of storage cell trains R1–4, C1–4, the number of terminals of row replacement determination unit 6100.1 and column replacement determination unit 6100.2, and the number of the C cells.

Some semiconductor memory devices or devices with a semiconductor memory device include memory cells identical in structure with the TG cell or the C cell, employed in other applications. For example, a cache memory or a tag memory to determine cache hit/miss are known. In the case where the circuits of the first to fourth embodiments are incorporated in such devices, the TG cell can be used in common with the tag memory or the C cell can be used in common with the cache memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a memory cell array in which a plurality of memory cells are arranged in a matrix for storing data, said memory cell array including
      a normal memory cell array including a plurality of normal memory cells, and
      a spare memory cell array including a plurality of spare memory cells;
   a memory cell select circuit for selecting said memory cell according to an address signal;
   a data transmission circuit for transferring data with respect to the selected memory cell; and
   a test circuit detecting a defective memory cell in said normal memory cell array for determining which said spare memory cell is to be used for replacement, said test circuit including
      a signal generation circuit generating said address signal to sequentially select said memory cells, and generating test data to be written into the selected memory cells in a test write operation, and providing expected value data to be read out from said memory cells in a test read out operation,
      a comparator circuit comparing stored data from said selected memory cell and said expected value data in said test read out operation,
      an address storage circuit for storing a defective address corresponding to a defective memory cell according to a comparison result of said comparator circuit, and
      a determination circuit determining which said spare memory cell is to be used for replacement according to said defective address stored in said address storage circuit,
      said address storage circuit selectively storing a defective address differing from a defective address already stored out of sequentially detected defective addresses.

2. The semiconductor device according to claim 1, wherein said spare memory cell array comprises
   m (m: natural number) spare memory cell rows, and
   n (n: natural number) spare memory cell columns,
   wherein said determination circuit comprises a plurality of replacement determination units provided corresponding to respective combinations of step sequence sequentially replacing a normal memory cell row or normal memory cell column including said defective memory cell with said m spare memory cell rows and said n spare memory cell columns,
   wherein said address storage circuit comprises
      first storage cell trains provided corresponding to said plurality of replacement determination units for storing m defective row addresses out of said defective addresses, and
      second storage cell trains provided corresponding to said plurality of replacement determination units for storing n defective column addresses out of said defective addresses,
      wherein each said replacement determination unit renders corresponding said first storage cell trains and said second storage cell trains active according to a corresponding step sequence when a defective memory cell is detected having a defective address differing in both row and column addresses from any of defective addresses already stored.

3. The semiconductor device according to claim 2, wherein each of said first storage cell trains includes a plurality of first comparison storage cells receiving each bit data of a row address signal generated from said signal generation circuit to compare with bit data already stored, a first match detection line through which a comparison result of said first comparison storage cell is transmitted, and a first write select line for designating writing of said bit data into said first comparison storage cell, wherein each of said second storage cell trains includes a plurality of second comparison storage cells receiving each bit data of a column address signal generated from said signal generation circuit to compare with bit data already stored, a second match detection line through which a comparison result of said second comparison storage cell is transmitted, and a second write select line for designating writing of said bit data into said second comparison storage cell, wherein said replacement determination unit selectively activates said first and second write select lines along said corresponding step sequence according to a comparison result transmitted through said first and second match detection lines.

4. The semiconductor device according to claim 3, wherein the bit data of said address signal is applied to said first and second comparison storage cells respectively as complementary signals, wherein each said storage cell train includes a precharge circuit precharging a level of a corresponding match detection line, wherein each of said first and second comparison storage cells includes a bistable element having first and second input nodes for storing corresponding bit data complementarily, a first access transistor coupling the first input node of said bistable element and one of said complementary signals according to activation of a corresponding one of said first and second write select lines, a second access transistor coupling the second input node of said bistable element and the other of said complementary signals according to activation of said corresponding one of said first and second write select lines, a first discharge circuit discharging said corresponding match detection line according to one of said complementary signals and a potential level of said second input node, and a second discharge circuit discharging said corresponding match detection line according to the other of said complementary signals and a potential level of said first input node.

5. The semiconductor device according to claim 3, wherein each of said first storage cell trains further includes a first update information storage circuit storing information that a corresponding first write select line has been rendered active out of said first write select lines, wherein each of said second storage cell trains further includes a second update information storage circuit storing information that a corresponding second write select line has been rendered active out of said second write select lines, wherein each said replacement determination unit includes a match determination circuit detecting whether a defective address already stored matches a newly detected defective address according to information from said first and second update information storage circuits and a comparison result transmitted through said first and second match detection lines, a write select circuit selectively rendering active said first and second write select lines along said corresponding step sequence according to a determination result of said match determination circuit and information from said first and second update information storage circuits, and a repair determination circuit determining repair impossibility according to whether a defective address is newly detected or not after detection of a defective address corresponding to a defective memory cell that is to be replaced with said m spare memory cell rows and said n memory cell columns.

6. The semiconductor device according to claim 1, wherein said spare memory cell array comprises m (m: natural number) spare memory cell rows, and n (n: natural number) spare memory cell columns, wherein said determination circuit comprises a plurality of replacement determination units provided corresponding to respective combinations of step sequence, sequentially replacing a normal memory cell row or normal memory cell column including said defective memory cell with said m spare memory cell rows and said n spare memory cell columns, wherein said address storage circuit comprises a plurality of storage cell trains provided for every step in said step sequence, i storage cell trains (i: natural number, $1 \leq i \leq m+n$) being provided in common to a group of said replacement determination units having a common replacement sequence up to i-th step, wherein each said replacement determination unit renders corresponding storage cell trains active along a corresponding step sequence when a defective memory cell is detected having a defective address differing in both row and column addresses from any of defective addresses already stored.

7. The semiconductor device according to claim 6, wherein each storage cell train out of said plurality of storage cell trains corresponding to replacement with said spare memory cell row includes a plurality of first comparison storage cells receiving each bit data of a row address signal generated from said signal generation circuit to compare with bit data already stored, a first match detection line through which a comparison result of said first comparison storage cell is transmitted, and a first write select line for designating writing of said bit data into said first comparison storage cell, wherein each storage cell train out of said plurality of storage cell trains corresponding to replacement with said spare memory cell column includes a plurality of second comparison storage cells receiving each bit data of a column address signal generated from said signal generation circuit to compare with bit data already stored, a second match detection line through which a comparison result of said second comparison storage cell is transmitted, and a second write select line for designating writing of said bit data into said second comparison storage cell, wherein said replacement determination unit selectively renders said first and second write select lines active along said corresponding step sequence according to a comparison result transmitted through said first and second match detection lines.

8. The semiconductor device according to claim 7, wherein the bit data of said address signal is applied to said first and second comparison storage cells as complementary signals, wherein each said storage cell train includes a precharge circuit precharging a level of a corresponding match detection line, wherein each of said first and second comparison storage cells includes
- a bistable element having first and second input nodes for storing corresponding bit data complementarily,
- a first access transistor coupling the first input node of said bistable element and one of said complementary signals according to activation of a corresponding one of said first and second write select lines,
- a second access transistor coupling the second input node of said bistable element and the other of said complementary signals according to activation of said corresponding one of said first and second write select lines,
- a first discharge circuit discharging said corresponding match detection line according to one of said complementary signals and a potential level of said second input node, and
- a second discharge circuit discharging said corresponding match detection line according to the other of said complementary signals and a potential level of said first input node.

9. The semiconductor device according to claim 7, wherein each storage cell train out of said plurality of storage cell trains corresponding to replacement with said spare memory cell row further includes a first update information storage circuit storing information that a corresponding first write select line out of said first write select lines has been rendered active, wherein each storage cell train out of said plurality of storage cell trains corresponding to replacement with said spare memory cell column further includes a second update information storage circuit storing information that a corresponding second write select line out of said second write select lines has been rendered active, wherein each said replacement determination unit includes
- a match determination circuit detecting whether a defective address already stored matches a newly detected defective address according to information from said first and second update information storage circuits and a comparison result transmitted through said first and second match detection lines,
- a write select circuit selectively rendering said first and second write select lines active along said corresponding step sequence according to a determination result of said match determination circuit and information from said first and second update information storage circuits, and
- a repair determination circuit determining repair impossibility according to whether a new defective address is detected or not after detection of a defective address corresponding to a defective memory cell that is to be replaced with respect to said m spare memory cell rows and said n spare memory cell columns.

10. The semiconductor device according to claim 1, wherein said spare memory cell array includes m (m: natural number) spare memory cell rows, and
n (n: natural number) spare memory cell columns, wherein said address storage circuit includes
- (m+n) first storage cell trains for storing (m+n) defective row addresses, and
- (m+n) second storage cell trains provided corresponding to said first storage cell trains for storing (m+n) defective column addresses, wherein said determination circuit stores, when a defective memory cell is detected having a defective address differing in both row and column addresses from any of defective addresses already stored in said first and second storage cell trains, the newly detected defective address into a next set of said first and second storage cell trains.

11. The semiconductor device according to claim 10, wherein said address storage circuit further includes
- (m+n) third storage cell trains provided corresponding to said (m+n) first storage cell trains, and
- (m+n) fourth storage cell trains provided corresponding to said (m+n) second storage cell trains, wherein said determination circuit stores data corresponding to a defective column address of a defective address having a row address identical to the defective row address stored in each said first storage cell train into a corresponding third storage cell train out of said third storage cell trains, and stores data corresponding to a defective row address of a defective address having a column address identical to the defective column address stored in each said second storage cell train into a corresponding fourth storage cell train out of said fourth storage cell trains.

12. The semiconductor device according to claim 10, wherein said determination circuit includes
- a row replacement determination unit provided corresponding to said first storage cell trains, and
- a column replacement determination unit provided corresponding to said second storage cell trains, wherein each of said first storage cell trains includes
- a plurality of first comparison storage cells receiving each bit data of a row address signal generated from said signal generation circuit to compare with bit data already stored,
- a first match detection line through which a comparison result of said first comparison storage cell is transmitted, and
- a first write select line for designating writing of said bit data into said first comparison storage cell, wherein each of said second storage cell trains includes
- a plurality of second comparison storage cells receiving each bit data of a column address signal generated from said signal generation circuit to compare with bit data already stored, and
- a second match detection line through which a comparison result of said second comparison storage cell is transmitted, and
- a second write select line for designating writing of said bit data into said second comparison storage cell, wherein said row replacement determination unit sequentially renders said first write select line active according to a comparison result transmitted through said first match detection line and a match detection result of said column replacement determination unit, and wherein said column replacement determination unit sequentially renders said second write select line active according to a comparison result transmitted through said second match detection line and a match detection result of said row replacement determination unit.

13. The semiconductor device of claim 1, wherein said address storage circuit selectively stores the defective address differing in both row and column addresses from any defective addresses already stored among sequentially detected defective addresses.

14. A testing device for a semiconductor device including a memory cell array having a normal memory cell array, m (m: natural number) spare memory cell rows, and n (n: natural number) spare memory cell columns, comprising:

a signal generation device generating an address signal to sequentially select a memory cell in said semiconductor memory device, and generating test data to be written into a selected memory cell in a test write operation and providing expected value data to be read out from said memory cell in a test read out operation;

a comparator comparing stored data from said selected memory cell with said expected value data in said test read out operation;

an address storage circuit for storing a defective address corresponding to a defective memory cell according to a comparison result of said comparator; and a determination circuit determining which of said spare memory cells is to be used for replacement according to said defective address stored in said address storage circuit, said address storage circuit selectively storing a defective address differing from a defective address already stored out of sequentially detected defective addresses.

15. The testing device for a semiconductor device according to claim 14, wherein said determination circuit comprises a plurality of replacement determination units provided corresponding to respective combinations of step sequence sequentially replacing a normal memory cell row or normal memory cell column including said defective memory cell with said m spare memory cell rows and said n spare memory cell columns, wherein said address storage circuit comprises first storage cell trains provided corresponding to s aid plurality of replacement determination units for storing m defective row addresses out of said defective addresses, and second storage cell trains provided corresponding to said plurality of replacement determination units for storing n defective column addresses out of said defective addresses, wherein each said replacement determination unit renders corresponding said first storage cell trains and said second storage cell trains active according to a corresponding step sequence when a defective memory cell is detected having a defective address differing in both row and column addresses from any of defective addresses already stored.

16. The testing device for a semiconductor device according to claim 14, wherein said determination circuit comprises a plurality of replacement determination unit s provided corresponding to respective combinations of step sequence sequentially replacing a normal memory cell row or a normal memory cell column including said defective memory cell with said m spare memory cell rows and said n spare memory cell columns, wherein said address storage circuit comprises a plurality of storage cell trains provided for every step in said step sequence, i storage cell trains (i: natural number, $1\leq i\leq m+n$) being provided in common to a group of said replacement determination units having a common replacement sequence up to i-th step, wherein each said replacement determination unit renders active corresponding storage cell trains active along a corresponding step sequence when a defective memory cell is detected having at least one of a row address and a column address differing from said defective row address and said defective column address already stored.

17. The testing device for a semiconductor device according to claim 14, wherein said address storage circuit includes (m+n) first storage cell trains for storing (m+n) defective row addresses, and (m+n) second storage cell trains provided corresponding to said first storage cell trains for storing (m+n) defective column addresses, wherein said determination circuit stores, when a defective memory cell is detected having a defective address differing in both row and column addresses from any of defective addresses already stored in said first and second storage cell trains, the newly detected defective address into a next set of said first and second storage cell trains.

18. The testing device for a semiconductor device according to claim 17, wherein said address storage circuit further includes (m+n) third storage cell trains provided corresponding to said (m+n) first storage cell trains, and (m+n) fourth storage cell trains provided corresponding to said (m+n) second storage cell trains, wherein said determination circuit stores data corresponding to a defective column address of a defective address having a row address identical to the defective row address stored in each said first storage cell train into a corresponding third storage cell train out of said third storage cell trains, and stores data corresponding to a defective row address of a defective address having a column address identical to the defective column address stored in each said second storage cell train into a corresponding fourth storage cell train out of said fourth storage cell trains.

19. The testing device for a semiconductor device of claim 14, wherein said address storage circuit selectively stores defective address differing in both row and column addresses from among any defective addresses already stored out of sequentially detected defective addresses.

* * * * *